(12) United States Patent
Mizusaki

(10) Patent No.: US 12,234,401 B2
(45) Date of Patent: Feb. 25, 2025

(54) ALIGNMENT FILM, DISPLAY DEVICE, METHOD FOR PRODUCING DISPLAY DEVICE, LIQUID CRYSTAL ALIGNMENT AGENT, AND LIQUID CRYSTAL COMPOSITION

(71) Applicant: SHARP KABUSHIKI KAISHA, Sakai (JP)

(72) Inventor: Masanobu Mizusaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 376 days.

(21) Appl. No.: 17/781,338

(22) PCT Filed: Dec. 9, 2019

(86) PCT No.: PCT/JP2019/048128
§ 371 (c)(1),
(2) Date: May 31, 2022

(87) PCT Pub. No.: WO2021/117104
PCT Pub. Date: Jun. 17, 2021

(65) Prior Publication Data
US 2023/0046964 A1  Feb. 16, 2023

(51) Int. Cl.
*C09K 19/12* (2006.01)
*C09K 19/20* (2006.01)
*C09K 19/32* (2006.01)
*G02F 1/1335* (2006.01)
*G02F 1/1337* (2006.01)
*H01L 27/32* (2006.01)
*H10K 59/12* (2023.01)
*H10K 59/38* (2023.01)

(52) U.S. Cl.
CPC .............. *C09K 19/12* (2013.01); *C09K 19/20* (2013.01); *C09K 19/32* (2013.01); *G02F 1/133541* (2021.01); *G02F 1/133614* (2021.01); *G02F 1/133723* (2013.01); *G02F 1/133788* (2013.01); *H10K 59/12* (2023.02); *H10K 59/38* (2023.02); *C09K 2019/122* (2013.01); *C09K 2019/2035* (2013.01); *H10K 59/1201* (2023.02)

(58) Field of Classification Search
None
See application file for complete search history.

(56) References Cited

U.S. PATENT DOCUMENTS

| 5,750,213 A * | 5/1998 | Onishi | C09K 19/3003 428/1.2 |
| 2013/0128204 A1* | 5/2013 | Mizusaki | G02F 1/133711 427/508 |
| 2015/0085236 A1 | 3/2015 | Kanehiro et al. | |
| 2019/0324320 A1* | 10/2019 | Mizusaki | G02F 1/133555 |
| 2020/0202752 A1 | 6/2020 | Mitani et al. | |

(Continued)

FOREIGN PATENT DOCUMENTS

JP    6437697 B1    12/2018
WO    2013/069487 A1    5/2013

(Continued)

*Primary Examiner* — Eli D. Strah
(74) *Attorney, Agent, or Firm* — ScienBiziP, P.C.

(57) ABSTRACT

Alignment films include a copolymer of a specific vertical alignment monomer and at least one of a specific anthracene-based monomer and a specific benzyl-based monomer.

20 Claims, 7 Drawing Sheets

(56) References Cited

U.S. PATENT DOCUMENTS

2020/0249509 A1 8/2020 Minoura et al.
2020/0402430 A1 12/2020 Mitani et al.

FOREIGN PATENT DOCUMENTS

| WO | 2013/133082 A1 | 9/2013 | |
|---|---|---|---|
| WO | WO-2017213072 A1 * | 12/2017 | ............. C09K 19/32 |
| WO | WO-2019009166 A1 * | 1/2019 | |
| WO | 2019/064575 A1 | 4/2019 | |

* cited by examiner

ALIGNMENT FILM, DISPLAY DEVICE, METHOD FOR PRODUCING DISPLAY DEVICE, LIQUID CRYSTAL ALIGNMENT AGENT, AND LIQUID CRYSTAL COMPOSITION

TECHNICAL FIELD

The disclosure relates to an alignment film, a display device, a method for manufacturing a display device, a liquid crystal alignment agent, and a liquid crystal composition.

BACKGROUND ART

When the surrounding environment is dark, the display is difficult to see in a reflection-type liquid crystal display device. On the other hand, a display device using a self-luminous element such as an organic light-emitting diode (OLED) has high luminance, while visibility is deteriorated in an environment with high ambient luminance (bright environment).

Thus, as a solution to such a problem, a display device in which a reflection-type liquid crystal display device and, for example, an OLED, which is a self-luminous element, are combined has been developed.

CITATION LIST

Patent Literature

PTL 1: JP 6437697 B

SUMMARY

Technical Problem

However, in the liquid crystal display device, it is necessary to form an alignment film for aligning liquid crystal molecules. As a method for forming the alignment film, a method in which a polymer solution such as a polyamic acid is applied as an alignment agent and then fired at a high temperature of 200° C. or higher to remove a solvent is typical. However, such high-temperature firing causes a damage such as decrease in emission luminance due to heat to the self-luminous element. In addition, in a case where a flexible substrate made of polyimide, polycarbonate, or the like is used as a support body, if high-temperature firing is performed, a contrast may not be expressed at the time of display in the reflection-type liquid crystal display device. This is because a retardation value that polyimide, polycarbonate, or the like slightly has changes due to high-temperature firing.

Note that, as a method for forming an alignment film, a method referred to as a polymer sustained alignment (PSA) technique that does not require high-temperature firing is also known. The PSA technique is a technique in which a liquid crystal material including a photopolymerizable monomer is encapsulated between a pair of substrates constituting a liquid crystal cell, and the liquid crystal material is irradiated with an active energy ray such as an ultraviolet ray in a state where a voltage is applied to a liquid crystal layer to polymerize the photopolymerizable monomer.

However, the reflection-type liquid crystal display device includes a reflector (e.g., a self-luminous element such as an OLED) on one of the substrates, and introduces a color conversion layer such as a color filter onto the other of the substrates to perform color display. In an array substrate (active substrate) provided with a self-luminous element such as an OLED, a metal is used for forming a thin film transistor, a wiring line, and the like, and thus ultraviolet irradiation cannot be performed from the array substrate side. Further, ultraviolet irradiation cannot be performed from a side of the substrate provided with the color conversion layer. This makes it impossible to form an alignment film by ultraviolet irradiation from the outside of the liquid crystal cell.

Accordingly, in order to form an alignment film without high-temperature firing, there is no choice but to polymerize monomers introduced into the liquid crystal layer by irradiation with visible light to near-ultraviolet light inside the liquid crystal cell.

However, a monomer or a combination of a plurality of monomers which can be aligned vertically by irradiation with visible light to near-ultraviolet light has not been known in the related art. With diligent investigation of the inventors of the present application, there is a material that can be polymerized with visible light, but liquid crystal molecules cannot be aligned in the material.

An aspect of the disclosure has been made in view of the above problem, and is directed to providing an alignment film that can be formed without high-temperature firing and a display device, a method for manufacturing the display device, and a liquid crystal alignment agent and a liquid crystal composition used in manufacturing the alignment film and the display device.

Solution to Problem

As a result of diligent investigation to solve the problem described above, the inventors of the present application have found a combination of monomers that can be copolymerized by near-ultraviolet light to visible light, and that copolymerization of the combination of monomers allows liquid crystal molecules to be aligned, and have achieved the disclosure.

In order to solve the problem described above, an alignment film according to one aspect of the disclosure is an alignment film for aligning liquid crystal molecules, the alignment film including at least a copolymer of a first monomer represented by the following general formula (1) and at least one of a second monomer represented by the following general formula (2) and a third monomer represented by the following general formula (3).

[Chemical Formula 1]

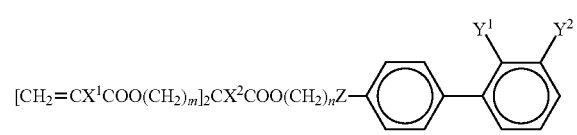

(1)

In the general formula (1) above, $X^1$ and $X^2$ each independently represent —H, —CH$_3$, or —C$_2$H$_5$, Z represents —O—, —S—, —NH—, —CO—, —COO—, —OCO—, or a direct bond, $Y^1$ and $Y^2$ each independently represent —H, —F, —Cl, —Br, a linear, branched, or cyclic alkyl group having from 1 to 6 carbon atoms, or a linear, branched, or cyclic alkyloxy group having 1 to 6 carbon atoms, m represents an integer from 6 to 16, and n represents an integer from 8 to 24.

[Chemical Formula 2]

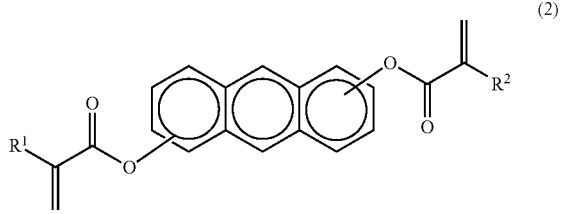

(2)

In the general formula (2) above, $R^1$ and $R^2$ each independently represent a hydrogen atom or a methyl group.

[Chemical Formula 3]

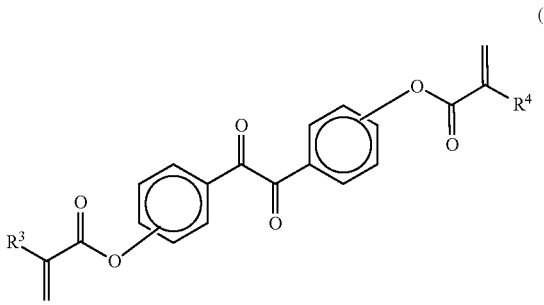

(3)

In the general formula (3) above, $R^3$ and $R^4$ each independently represent a hydrogen atom or a methyl group.

In order to solve the above problem, a display device according to one aspect of the disclosure includes, between a first insulating substrate and a second insulating substrate, a thin film transistor layer including a plurality of thin film transistors, a light-emitting element layer including a plurality of light-emitting elements, a first alignment film, a liquid crystal layer, and a second alignment film, in this order from the first insulating substrate side, and at least one of the first alignment film and the second alignment film is the alignment film described in the one aspect of the disclosure.

In order to solve the above problem, a method for manufacturing a display device according to one aspect of the disclosure is a method for manufacturing the display device described in the one aspect of the disclosure, the method including: forming an array substrate including the first insulating substrate, the thin film transistor layer, and the light-emitting element layer; forming a counter substrate including the second insulating substrate; encapsulating a liquid crystal composition including at least a liquid crystal material, the first monomer, and at least one of the second monomer and the third monomer between the array substrate and the counter substrate to form a liquid crystal layer; and copolymerizing at least the first monomer and at least one of the second monomer and the third monomer by light emission of the light-emitting elements to form the first alignment film in contact with the liquid crystal layer on the array substrate, while forming the first alignment film in contact with the liquid crystal layer on the counter substrate.

To solve the above problem, a liquid crystal alignment agent according to one aspect of the disclosure includes a first monomer represented by the general formula (1) above, and at least one of a second monomer represented by the general formula (2) above and a third monomer represented by the general formula (3) above.

In order to solve the problem described above, a liquid crystal composition according to one aspect of the disclosure includes the liquid crystal alignment agent described in the one aspect of the disclosure and a liquid crystal material.

Advantageous Effects of Disclosure

The first monomer and at least one of the second monomer and the third monomer can be copolymerized by near-ultraviolet light to visible light, and copolymerization of the monomers allows liquid crystal molecules to be aligned. Thus, according to one aspect of the disclosure, it is possible to provide an alignment film that can be formed without high-temperature firing and a display device, a method for manufacturing the display device, and a liquid crystal alignment agent and a liquid crystal composition used for manufacturing the alignment film and the display device.

DESCRIPTION OF EMBODIMENTS

An embodiment of the disclosure will be described below with reference to FIGS. 1 to 12.

Schematic Configuration of Display Device

Figure 1:
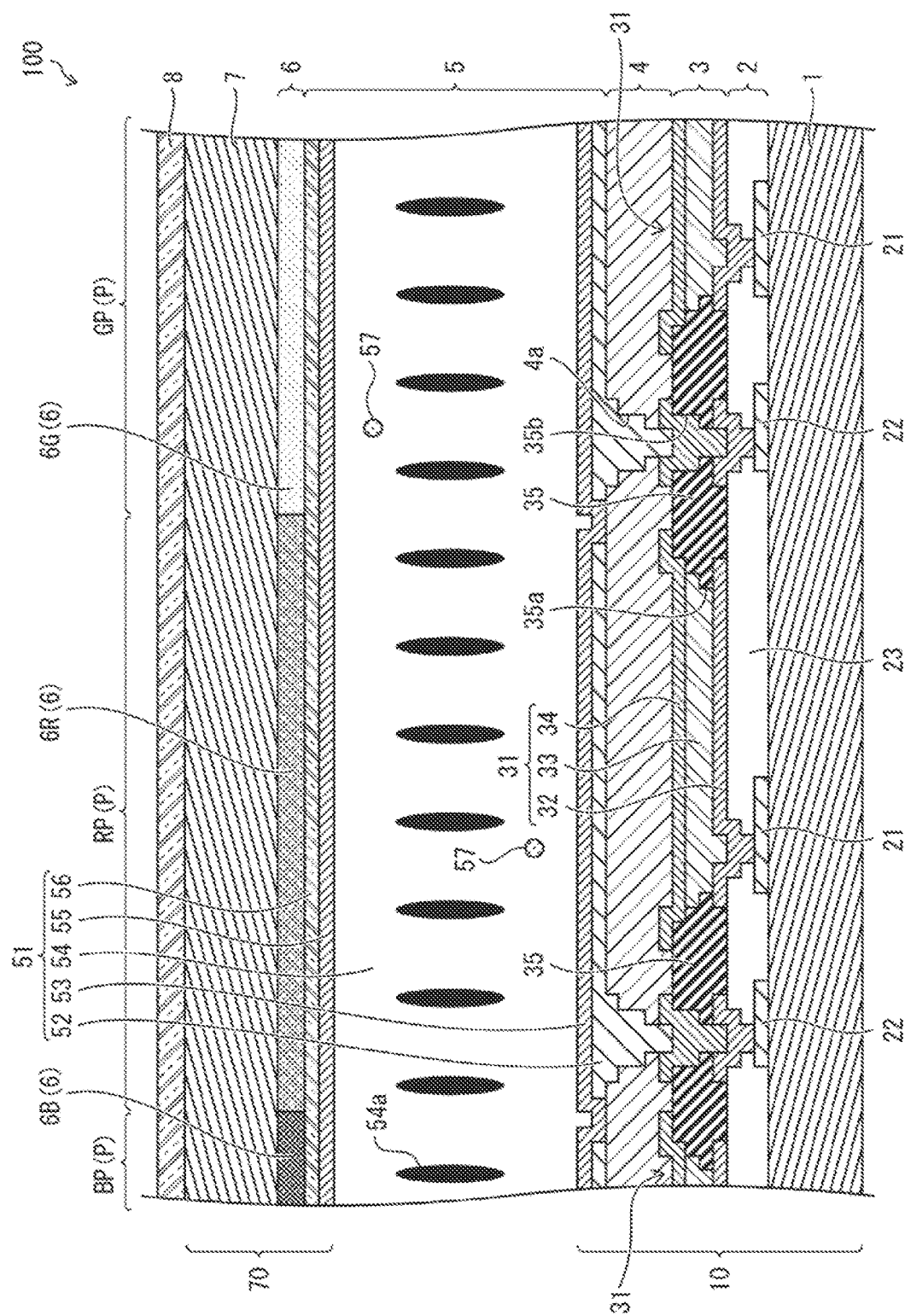
FIG. 1 is a cross-sectional view illustrating a schematic configuration of main portions of a display device according to an embodiment.

FIG. 1 is a cross-sectional view illustrating a schematic configuration of main portions of a display device 100 according to the present embodiment. Note that in FIG. 1, as an alignment state of liquid crystal molecules 54a, an alignment state when no voltage is applied is illustrated.

As illustrated in FIG. 1, the display device 100 includes an array substrate 10, a counter substrate 70, a liquid crystal layer 54 sandwiched between the array substrate 10 and the counter substrate 70, and a circular polarizer 8 provided on a side of the counter substrate 70, the side opposite to the array substrate 10.

The array substrate 10 is an electrode substrate (element substrate) in which a light-emitting element 31 and a pixel electrode 52 are formed for each pixel P. The array substrate 10 has a configuration in which a thin film transistor layer (hereinafter, described as a "TFT layer") 2, a light-emitting element layer 3, an insulating layer 4, a plurality of the pixel electrodes 52, and an alignment film 53 (first alignment film) are layered in this order on an insulating substrate 1 (first insulating substrate). A plurality of the light-emitting elements 31 are provided in the light-emitting element layer 3.

On the other hand, the counter substrate 70 is an electrode substrate having a common electrode 56 common to all the pixels P as a counter electrode facing the pixel electrodes 52 with the liquid crystal layer 54 interposed therebetween. The counter substrate 70 has a configuration in which a color conversion layer 6, the common electrode 56, and an alignment film 55 (second alignment film) are layered in this order on an insulating substrate 7 (second insulating substrate).

The array substrate 10 and the counter substrate 70 are disposed to face each other with surfaces facing inside, the surfaces on which the respective layers of the array substrate 10 and the counter substrate 70 are formed, in such a manner that a liquid crystal element 51 is formed between a pair of the insulating substrates 1, 7. The array substrate 10 and the counter substrate 70 are bonded to each other with a constant gap therebetween using a sealing agent (not illustrated) in respective outer peripheral portions.

The liquid crystal element 51 includes the pixel electrode 52, the alignment film 53, the liquid crystal layer 54, the alignment film 55, and the common electrode 56. A layer in which the pixel electrode 52, the alignment film 53, the liquid crystal layer 54, the alignment film 55, and the common electrode 56 are provided is a liquid crystal element layer 5. The liquid crystal element layer 5 is provided with a plurality of the liquid crystal elements 51.

Thus, it can also be said that the display device 100 has a configuration in which the TFT layer 2, the light-emitting element layer 3, the insulating layer 4, the liquid crystal element layer 5, and the color conversion layer 6 are sandwiched between a pair of the insulating substrates 1, 7 and the circular polarizer 8 is provided on a surface of the insulating substrate 7 on the side opposite to the insulating substrate 1.

The insulating substrates 1, 7 each are a support body (base substrate) having an insulating property. Of the insulating substrates 1, 7, at least for the insulating substrate 7 on a side of light extraction, a transparent insulating substrate is used. The insulating substrates 1, 7 each may be, for example, a glass substrate, but are preferably a flexible substrate such as a plastic substrate or a resin film. Examples of the material of the flexible substrate (i.e., the material of the plastic substrate or the material of the resin film) include polyimide and polycarbonate. In particular, the resin film is used for the insulating substrates 1, 7 to achieve thinning, so that a foldable display device, which is the display device 100, can be obtained.

In the display device 100, a plurality of the pixels P are provided in a matrix shape, for example. The TFT layer 2 includes a light-emitting element pixel circuit that controls the light-emitting elements 31 in the light-emitting element layer 3, a liquid crystal element pixel circuit that controls the liquid crystal elements 51 in the liquid crystal element layer 5 for each pixel P, and a flattening film 23 that covers the light-emitting element pixel circuit and the liquid crystal element pixel circuit.

The light-emitting element pixel circuit includes a plurality of first thin film transistors (hereinafter, described as "first TFTs") 21 that drive the light-emitting elements 31. The liquid crystal element pixel circuit includes a plurality of second thin film transistors (hereinafter, described as "second TFTs") 22 that drive the liquid crystal elements 51 for each pixel P. In addition, a plurality of bus lines (not illustrated) that are electrically connected to the first TFTs 21 and the second TFTs 22 are provided in the TFT layer 2. The plurality of bus lines include a plurality of gate bus lines and a plurality of source bus lines.

The plurality of gate bus lines are provided in a row direction in a display region. The plurality of source bus lines are provided in a column direction in the display region so as to intersect the gate bus lines. Regions surrounded by these gate bus lines and source bus lines are the pixels P. Each first TFT 21 and each second TFT 22 are provided for each pixel P.

Gate electrodes of the second TFTs 22 are connected to the gate bus lines, and source electrodes (or drain electrodes) of the second TFTs 22 are connected to the source bus lines. Further, the drain electrodes (or source electrodes) of the second TFTs 22 are connected to gate electrodes of the first TFTs 21 and the pixel electrodes 52 of the liquid crystal elements 51. Further, source electrodes (or drain electrodes) of the first TFTs 21 are connected to current supply bus lines (not illustrated) that supply current to the light-emitting elements 31. The drain electrodes (or source electrodes) of the first TFTs 21 are connected to first electrodes 32 described below in the light-emitting elements 31.

Thus, the second TFTs 22 electrically connects the first TFTs 21 and the liquid crystal elements 51 to the source bus lines, based on a potential of the gate bus lines.

The first TFTs 21 change a magnitude of the current supplied to the light-emitting elements 31, based on the potential of the source bus lines. When the first TFTs 21 are turned ON (on), a drive current flows through the current supply bus lines and the drain electrodes (or source electrodes) of the first TFTs 21 into the light-emitting elements 31 to cause a light-emitting layer to emit light.

The flattening film 23 covers the plurality of first TFTs 21, the plurality of second TFTs 22, and the plurality of bus lines. The flattening film 23 is an insulating film made of an organic insulating material such as an acrylic resin or a polyimide resin. The flattening film 23 flattens unevenness on the first TFTs 21, the second TFTs 22, and the bus lines. An organic insulating film such as an acrylic resin or polyimide is used for the flattening film 23.

The light-emitting element layer 3 is provided on the flattening film 23 of the TFT layer 2. The light-emitting element layer 3 includes a plurality of light-emitting elements 31 and a bank 35.

The light-emitting elements 31 each have a configuration in which a function layer 33 including at least the light-emitting layer is sandwiched between the first electrode 32 and a second electrode 34. In the following, a case where the light-emitting elements 31 each are an organic light-emitting diode (OLED) will be described as an example.

The first electrode 32 is formed into an island shape for each pixel P on the flattening film 23. The second electrode 34 is a solid-like electrode (common electrode) provided in common to all the pixels P.

The light-emitting elements 31 each are a top-emission type light-emitting element. Thus, the second electrode 34, which is an upper layer, is formed of a light-transmissive electrode made of a light-transmissive material, and the first electrode 32, which is a lower layer, is formed of a reflective electrode made of a light-reflective material.

As the light-transmissive material, a transparent conductive film material can be used, for example. For example, indium tin oxide (ITO), indium zinc oxide (IZO), or the like can be used as the transparent conductive film material. These materials have a high transmittance of visible light, and thus luminous efficiency is improved.

For example, a metal material such as Al (aluminum), Ag (silver), Cu (copper), Au (gold), or APC (AgPdCu) can be used as the light-reflective material. These materials have a high reflectivity of visible light, and thus luminous efficiency is improved.

In addition, the first electrode 32 may be used as a reflective electrode with light reflectivity by making the first electrode 32 a layered body including a layer made of a light-transmissive material and a layer made of a light-reflective material. Alternatively, on the flattening film 23, a reflective electrode with light reflectivity may be obtained by forming a reflective film made of, for example, APC or the like into a solid shape, and forming, thereon, a layer made of a light-transmissive material into an island shape.

The function layer 33 may be a light-emitting layer, or may be a layered film of a multilayer structure including a light-emitting layer and a carrier transport layer that transports carriers to the light-emitting layer. In addition, the function layer 33 may further include a carrier injection layer that injects carriers into the carrier transport layer. For example, in a case where the first electrode 32 is an anode and the second electrode 34 is a cathode, the function layer 33 may have a configuration in which a hole injection layer, a hole transport layer, a light-emitting layer, an electron transport layer, and an electron injection layer are layered in this order from the lower layer side. Note that in a case where the first electrode 32 is a cathode and the second electrode 34 is an anode, the layered order of the hole injection layer, the hole transport layer, the light-emitting layer, the electron transport layer, and the electron injection layer is inverted. Needless to say, it is also possible to adopt a configuration in which one or more of the hole injection layer, the hole transport layer, the electron transport layer, and the electron injection layer are not formed.

The bank 35 is formed in a lattice pattern, for example. The bank 35 functions as a pixel separation wall that separates the light-emitting elements 31 for each pixel P, and functions as an edge cover covering edges of the first electrodes 32. For example, an organic insulating material such as an acrylic resin or polyimide is used for the bank 35.

The light-emitting layer is formed in an island shape for each of openings 35a of the bank 35 (in other words, for each pixel P). A layer other than the light-emitting layer in the function layer 33 may be formed in an island shape for each of the opening 35a of the bank 35, or may be formed in a solid shape as a common layer that is common to all the pixels P.

As described above, at least the light-emitting layer in the first electrode 32 and the function layer 33 is separated into an island shape for each pixel P by the bank 35. In this way, a plurality of light-emitting elements 31 corresponding to the pixels P are provided in the display device 100.

When the light-emitting elements 31 each are an OLED, an organic layer is used for the function layer 33. All the light-emitting elements 31 each are a light-emitting element that emits near-ultraviolet to blue light having a light emission peak wavelength in a wavelength band equal to or longer than 360 nm and equal to or shorter than 500 nm, and a light-emitting material of the light-emitting layer is selected in such a manner that emission of near-ultraviolet to blue light can be obtained when the light-emitting elements 31 are energized. Thus, in the present embodiment, the light-emitting elements 31 emit light in a color common to the pixels P. This causes the entire light-emitting element layer 3 to emit light of the same color.

Note that, in the present embodiment, light of near-ultraviolet (near-ultraviolet light) refers to light having a light emission peak wavelength in a wavelength band equal to or longer than 360 nm and equal to or shorter than 400 nm. Further, light of blue color (blue light) refers to light having a light emission peak wavelength in a wavelength band equal to or longer than 400 nm and equal to or shorter than 500 nm. Note that preferably, the light-emitting elements 31 each have a light emission peak wavelength in a wavelength band equal to or longer than 420 nm and equal to or shorter than 490 nm.

The light-emitting elements 31 are covered with the insulating layer 4 formed on the light-emitting element layer 3 and having light transmissivity. The insulating layer 4 includes an inorganic layer, and functions as a sealing layer that prevents deterioration of the light-emitting elements 31 due to infiltration of moisture and oxygen. Further, desirably, the insulating layer 4 functions as a flattening layer for flattening unevenness on the light-emitting elements 31 and further includes an organic layer.

Thus, the insulating layer 4 is formed of an inorganic layer, or a layered body of an inorganic layer and an organic layer. The insulating layer 4 desirably has a configuration in which a first inorganic layer, an organic layer, and a second inorganic layer are layered in this order, for example. The inorganic layers (for example, the first inorganic layer and the second inorganic layer) have a moisture prevention function to prevent moisture and oxygen from entering, and function as a barrier layer (moisture prevention layer). On the other hand, the organic layer is used as a buffer layer. The organic layer may relieve the stress of the inorganic layers, level the surfaces of the light-emitting elements 31 by filling up a step, eliminate a pinhole, and suppress cracking and film peeling during layering of the inorganic layers.

For the inorganic layers, for example, an inorganic insulating film having light transmissivity, such as silicon nitride (SiN) or silicon oxide ($SiO_2$), is used. For the organic layer, an organic insulating film having light transmissivity, such as an acrylic resin or polyimide, is used.

The liquid crystal element layer 5 is formed on the insulating layer 4. The liquid crystal element layer 5 is provided with the liquid crystal element 51 for each pixel P. As described above, the pixel electrode 52 and the alignment film 53 in the liquid crystal element 51 are formed in the array substrate 10. The pixel electrode 52 is formed in an island shape for each pixel P on the insulating layer 4. The pixel electrode 52 is connected to the second TFT 22 via a contact hole 4a provided in the insulating layer 4 and a contact hole 35b provided in the bank 35. The alignment film 53 is formed in a solid shape on the insulating layer 4 so as to cover all the pixel electrodes 52 as a common layer common to all the pixels P.

On the other hand, the alignment film 55 and the common electrode 56 are formed on the counter substrate 70. As described above, the common electrode 56 is formed in a solid shape as a common layer common to all the pixels P on the color conversion layer 6 of the counter substrate 70. Further, the alignment film 55 is formed in a solid shape as a common layer common to all the pixels P on the common electrode 56. The alignment film 53 and the alignment film 55 are provided in contact with the liquid crystal layer 54 while sandwiching the liquid crystal layer 54. The liquid crystal layer 54 is sandwiched between the array substrate 10 and the counter substrate 70 by encapsulating a liquid crystal material in a gap formed between the array substrate 10 and the counter substrate 70.

The pixel electrode 52 and the common electrode 56 each are a light-transmissive electrode formed of a light-transmissive material. As the light-transmissive material, a transparent conductive film material such as ITO or IZO can be used.

An electric field is applied to the liquid crystal layer 54 by a voltage applied to the pixel electrode 52 and the common electrode 56, thereby forming an image.

The liquid crystal element 51 is a liquid crystal element configured to perform display by a vertical alignment method (e.g., a VA method), and the liquid crystal layer 54 is a vertical alignment type liquid crystal layer. The liquid crystal molecules 54a have negative dielectric anisotropy.

The alignment films 53, 55 are vertical alignment films that align the liquid crystal molecules 54a of the liquid crystal layer 54 in directions perpendicular to the surfaces of the array substrate 10 and the counter substrate 70 (specifically, directions perpendicular to the substrate surfaces of the insulating substrates 1, 7) when no voltage is applied.

In the present embodiment, the liquid crystal molecules 54a are aligned perpendicularly (vertically-aligned) to the substrate surfaces of the insulating substrates 1, 7 when no voltage is applied, and are caused to fall when a voltage is applied, thereby performing display. Note that the alignment films 53, 55 will be described in detail below.

The circular polarizer 8 is provided outside a liquid crystal cell in which the liquid crystal layer 54 are sandwiched between the array substrate 10 and the counter substrate 70. The circular polarizer 8 is formed in a solid shape as a common layer common to all the pixels P on a surface of the insulating substrate 7 on the side opposite to the insulating substrate 1.

The circular polarizer 8 has a function of transmitting only a specific circular polarized light among incident external light. The circular polarizer 8 is formed by layering a linear polarizer and a λ/4 wavelength plate while tilting the optical axes of the linear polarizer and the λ/4 wavelength plate by a constant angle, for example.

For example, the liquid crystal elements 51 become in a dark display state to display black when no voltage is applied, and meanwhile, when a voltage is applied, the reflectivity is gradually increased, and the liquid crystal elements 51 become in a bright display state to display white. In order to suppress reflection of external light, the liquid crystal elements 51 are desirably configured to be in a normally black (NB) mode by collaboration of the circular polarizer 8, the alignment films 53, 55, and the liquid crystal layer 54 in this way. In the liquid crystal layer 54, the dielectric anisotropy of the liquid crystal material is selected in such a manner that the liquid crystal molecules 54a are vertically aligned when no voltage is applied.

The liquid crystal elements 51 each are a reflection-type liquid crystal element, and external light incident on each of the liquid crystal elements 51 through the circular polarizer 8 passes through the liquid crystal element 51 and the second electrode 34 of the light-emitting element 31, and is reflected on the first electrode 32 of the light-emitting element 31. Then, after being reflected on the first electrode 32 and passing through the second electrode 34 and the liquid crystal element 51, the light passes through the circular polarizer 8 and is emitted to the outside.

The display device 100 includes a red pixel RP that emits red light, a green pixel GP that emits green light, and a blue pixel BP that emits blue light, as the pixels P.

Thus, the display device 100 is provided with the color conversion layer 6 so as to enable color display, in addition to the liquid crystal elements 51 and the light-emitting element 31. As described above, each pixel P is provided with a light-emitting element configured to emit near-ultraviolet to blue light as the light-emitting element 31. In a case where the light-emitting element 31 is a light-emitting element that emits blue light (blue light-emitting element), a pixel RP is provided with a color conversion layer 6R that converts blue light emitted from the light-emitting layer of the light-emitting element 31 provided in the pixel RP into red light, as the color conversion layer 6. A pixel GP is provided with a color conversion layer 6G that converts blue light emitted from the light-emitting layer of the light-emitting element 31 provided in the pixel GP into green light, as the color conversion layer 6. A pixel BP may be provided with a color conversion layer 6B that transmits blue light emitted from the light-emitting layer of the light-emitting element 31 provided in the pixel BP as it is, or may be provided with a normal blue color filter that transmits blue light. Needless to say, no color conversion layer may be provided as the color conversion layer 6B.

In a case where the light-emitting element 31 is a light-emitting element that emits near-ultraviolet light (near-ultraviolet light-emitting element), a pixel RP is provided with a color conversion layer 6R that converts near-ultraviolet light emitted from the light-emitting layer of the light-emitting element 31 provided in the pixel RP to red light, as the color conversion layer 6. A pixel GP is provided with a color conversion layer 6G that converts near-ultraviolet light emitted from the light-emitting layer of the light-emitting element 31 provided in the pixel GP to green light, as the color conversion layer 6. A pixel BP is provided with a color conversion layer 6B that converts near-ultraviolet light emitted from the light-emitting layer of the light-emitting element 31 provided in the pixel BP to blue light, as the color conversion layer 6.

Note that here, the red light refers to light having a light emission peak wavelength in a wavelength band equal to or longer than 600 nm and equal to or shorter than 780 nm. The green light refers to light having a light emission peak wavelength in a wavelength band equal to or longer than 500 nm and equal to or shorter than 600 nm.

For the color conversion layer 6, for example, a color conversion layer using quantum dots is used. For example, for the color conversion layer 6R, a color conversion layer including quantum dots each having a red perovskite crystal structure that absorbs blue light or near-ultraviolet light emitted from the light-emitting element 31 and emits red light is used. For the color conversion layer 6G, a color conversion layer including quantum dots each having a green perovskite crystal structure that absorbs blue light or near-ultraviolet light emitted from the light-emitting element 31 and emits green light is used. For the color conversion layer 6B, a color conversion layer including quantum dots each having a blue perovskite crystal structure that absorbs blue light or near-ultraviolet light emitted from the light-emitting element 31 and emits blue light is used.

Alignment Films 53, 55

Next, the alignment films 53, 55 will be described. The alignment films 53, 55 each are a polymerized alignment layer that is polymerized by near-ultraviolet or blue light.

The alignment films 53, 55 each are formed of a liquid crystal alignment agent including at least a first monomer and at least one of a second monomer and a third monomer (i.e., one or both of the second monomer and the third monomer). Specifically, the alignment films 53, 55 can be formed by copolymerizing at least the first monomer and at least one of the second monomer and the third monomer (i.e., one or both of the second monomer and the third monomer).

The first monomer is a vertical alignment monomer (first monomer) represented by the following general formula (1).

[Chemical Formula 4]

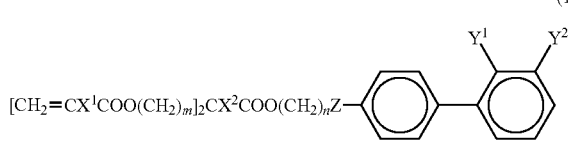

(1)

Note that, in the general formula (1) above, $X^1$ and $X^2$ each independently represent —H, —CH$_3$, or —C$_2$H$_5$. Z represents —O—, —S—, —NH—, —CO—, —COO—, —OCO—, or a direct bond. $Y^1$ and $Y^2$ each independently represent —H, —F, —Cl, —Br, a linear, branched, or cyclic alkyl group having from 1 to 6 carbon atoms, or a linear, branched, or cyclic alkyloxy having from 1 to 6 carbon atoms. m represents an integer from 6 to 16, and n represents an integer from 8 to 24.

The second monomer is an anthracene-based monomer represented by the following general formula (2).

[Chemical Formula 5]

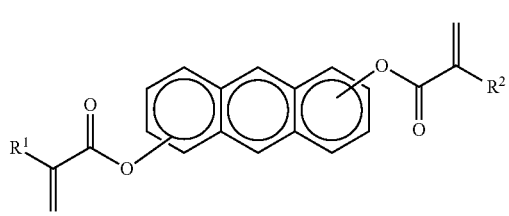

(2)

Note that in the general formula (2) above, $R^1$ and $R^2$ each independently represent a hydrogen atom or a methyl group.

The third monomer is a benzyl-based monomer represented by the following general formula (3).

[Chemical Formula 6]

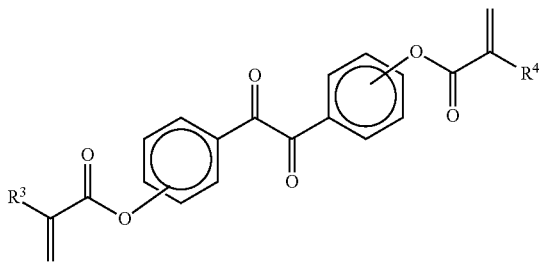

(3)

Note that in the general formula (3) above, $R^3$ and $R^4$ each independently represent a hydrogen atom or a methyl group.

Thus, the alignment films 53, 55 each include a copolymer of at least the first monomer and at least one of the second monomer and the third monomer. Accordingly, the copolymer includes at least a structural unit derived from the first monomer and a structural unit derived from at least one of the second monomer and the third monomer.

The structural unit derived from the first monomer has a structure represented by the following general formula (1-A) or (1-B), for example.

[Chemical Formula 7]

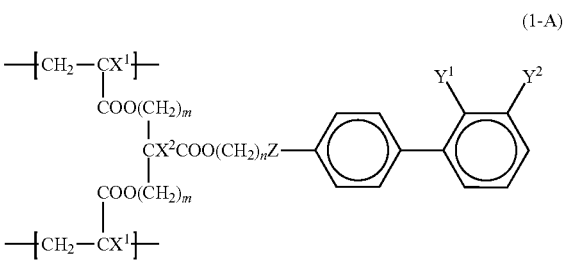

(1-A)

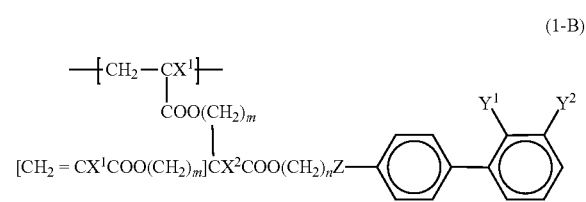

(1-B)

The structural unit derived from the second monomer has a structure represented by the following general formula (2-A) or (2-B), for example.

[Chemical Formula 8]

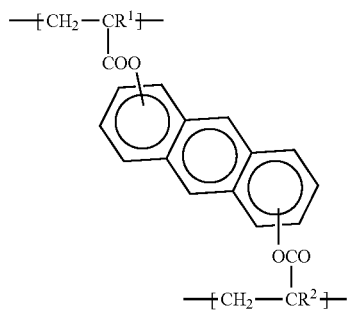

(2-A)

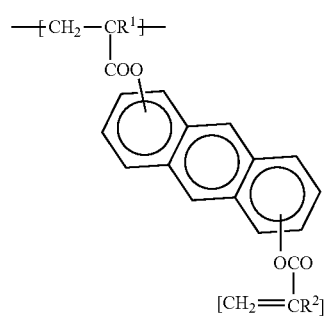

(2-B)

The structural unit derived from the third monomer has a structure represented by the following general formula (3-A) or (3-B), for example.

[Chemical Formula 9]

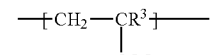

(3-A)

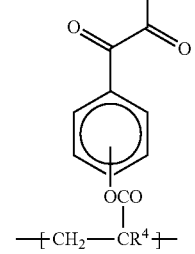

(3-B)

Note that $X^1$, $X^2$, $Y^1$, $Y^2$, m, and n in the general formulas (1-A) and (1-B) are the same as $X^1$, $X^2$, $Y^1$, $Y^2$, m, and n in the general formula (1). Further, $R^1$ and $R^2$ in the general formulas (2-A) and (2-B) are the same as $R^1$ and $R^2$ in the general formula (2). $R^3$ and $R^4$ in the general formulas (3-A) and (3-B) are the same as $R^3$ and $R^4$ in the general formula (3).

Examples of the copolymer including the structural unit derived from the first monomer and the structural unit derived from the second monomer include a copolymer represented by the following structural formula (4).

[Chemical Formula 10]
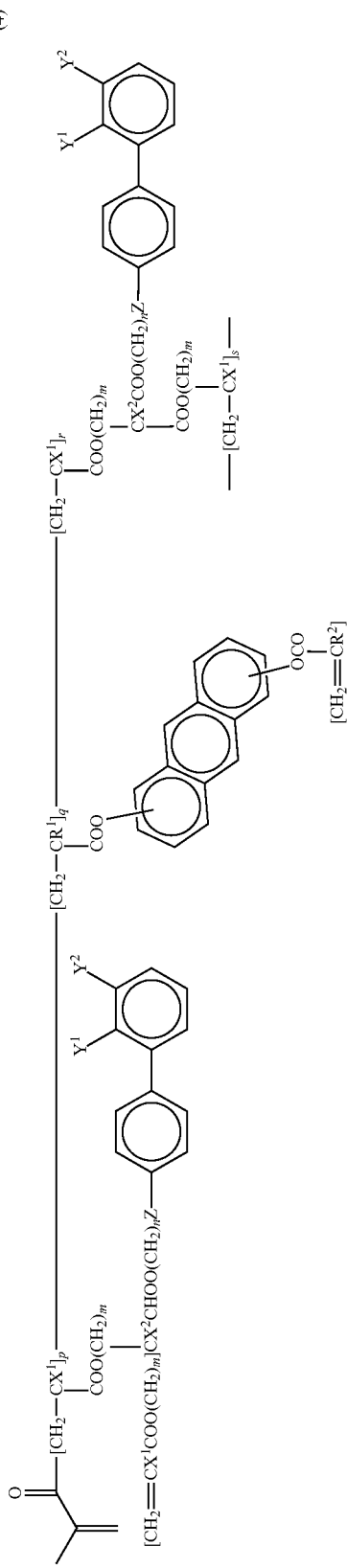

Note that $X^1$, $X^2$, $Y^1$, $Y^2$, m, and n in the structural formula (4) above are the same as $X^1$, $X^2$, $Y^1$, $Y^2$, m, and n in the general formula (1). Further, $R^1$ and $R^2$ in the structural formula (4) above are the same as $R^1$ and $R^2$ in the general formula (2). Note that in the structural formula (4) above, p represents an integer from 1 to 100, q represents an integer from 1 to 50, r represents an integer of 1 to 100, and s represents an integer from 1 to 100.

Examples of the copolymer including the structural unit derived from the first monomer and the structural unit derived from the third monomer include a copolymer represented by the following structural formula (5).

[Chemical Formula 11]
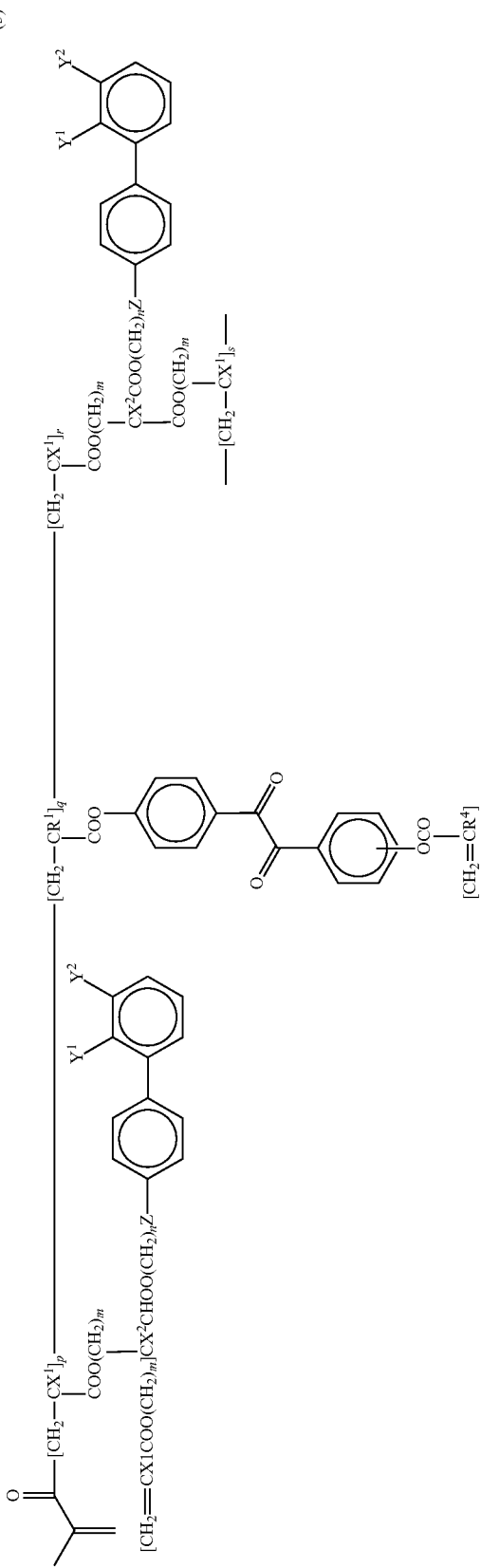
(5)

Note that $X^1$, $X^2$, $Y^1$, $Y^2$, m, and n in the structural formula (5) above are the same as $X^1$, $X^2$, $Y^1$, $Y^2$, m, and n in the general formula (1). Further, $R^3$ and $R^4$ in the structural formula (5) above are the same as $R^3$, $R^4$ in the general formula (3). Note that in the structural formula (5) above, p represents an integer from 1 to 100, q represents an integer from 1 to 50, r represents an integer from 1 to 100, and s represents an integer from 1 to 100.

Note that as described above, the copolymer constituting the alignment films 53, 55 only needs to include at least the structural unit derived from the first monomer and the structural unit derived from at least one of the second monomer and the third monomer.

Thus, the copolymer constituting the alignment films 53, 55 may include the structural unit derived from the first monomer, the structural unit derived from the second monomer, and the structural unit derived from the third monomer. Examples of such a copolymer include a copolymer including both the structure represented by the structural formula (4) above and the structure represented by the structural formula (5) above.

Further, the alignment films 53, 55 may include at least one of the copolymer represented by the structural formula (4) above and the copolymer represented by the structural formula (5) above as the copolymer constituting the alignment films 53, 55. In other words, the copolymer constituting the alignment films 53, 55 may include at least one of the copolymer represented by the structural formula (4) above and the copolymer represented by the structural formula (5) above.

Specific examples of the first monomer include monomers represented by the following structural formulas (1-1) to (1-8).

[Chemical Formula 12]

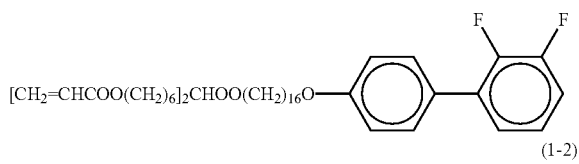

(1-1)

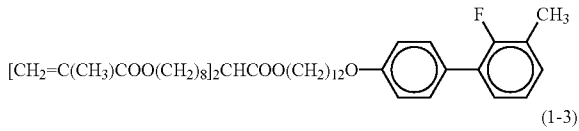

(1-2)

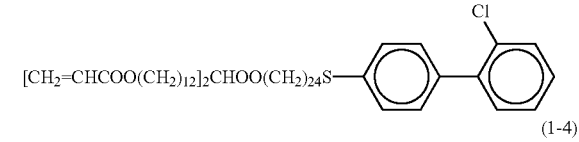

(1-3)

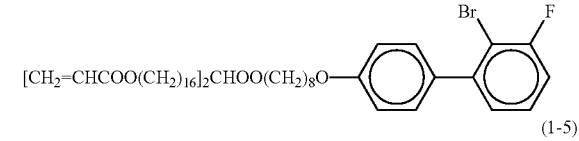

(1-4)

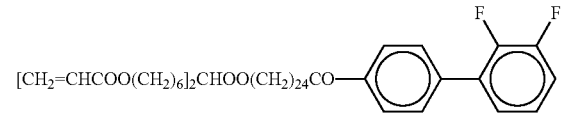

(1-5)

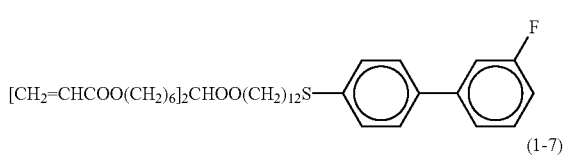

(1-6)

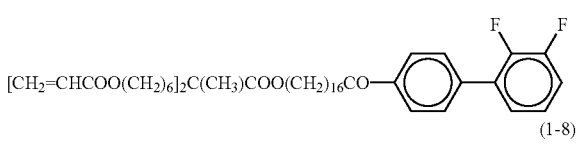

(1-7)

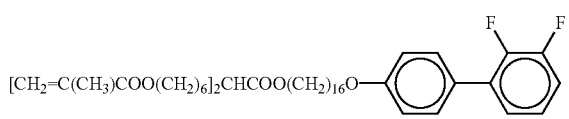

(1-8)

These monomers may be used alone or may be used in combination of two or more as appropriate. Thus, the first monomer may include at least one of the monomers represented by the structural formulas (1-1) to (1-8) above. In other words, the copolymer may include a structural unit derived from at least one of the monomers represented by the structural formulas (1-1) to (1-8) above, as the structural unit derived from the first monomer.

The first monomer is a vertical alignment monomer. The alignment films 53, 55 can align (vertically align) the liquid crystal molecules 54a of the liquid crystal layer 54 in a direction perpendicular to the surfaces of the array substrate 10 and the counter substrate 70 by an action of the structural unit derived from the first monomer in the copolymer described above.

As described above, the liquid crystal elements 51 each are a liquid crystal element configured to perform display by the vertical alignment method (VA method).

In each of the liquid crystal elements 51, in a case where the voltage applied to the liquid crystal layer 54 is less than a threshold voltage (including the case where no voltage is applied), alignment control of the liquid crystal molecules 54a is performed by the alignment films 53, 55. Here, the liquid crystal molecules 54a being vertically aligned to the surfaces of the array substrate 10 and the counter substrate 70 means that a pre-tilt angle of the liquid crystal molecules 54a is from 86° to 90° with respect to the surfaces of the array substrate 10 and the counter substrate 70. A preferred pre-tilt angle is from 88.5° to 90°.

The pre-tilt angle of the liquid crystal molecules 54a refers to an angle at which the long axis of the liquid crystal molecules 54a is inclined with respect to the surfaces of the array substrate 10 and the counter substrate 70 in a case where the applied voltage to the liquid crystal layer 54 is less than the threshold voltage (including the case where no voltage is applied).

A biphenyl group (aromatic group) is introduced into the terminal of an alkylene group (vertical alignment group) in the first monomer, and thus an alignment regulating force that vertically aligns the liquid crystal molecules 54a is sufficiently obtained. Furthermore, as in the monomers represented by the structural formulas (1-1) to (1-8), when a halogen group (—F, —Cl, —Br) is introduced into the biphenyl group, the alignment regulating force that vertically aligns the liquid crystal molecules 54a is further enhanced. In contrast, in a monomer in which no biphenyl group is introduced into the terminal of the alkylene group, the alignment regulating force that vertically aligns the liquid crystal molecules 54*a* is relatively weak, and the alignment regulating force is insufficient.

The first monomer is composed of an aliphatic compound except for the terminal of a side chain and has a molecular structure with excellent flexibility. Thus, in forming the alignment films 53, 55, when at least the first monomer and at least one of the second monomer and the third monomer are copolymerized, even with light irradiation under an environment of less than a nematic phase-isotropic phase transition temperature of the liquid crystal material of the liquid crystal layer 54 (e.g., in an ambient temperature environment), the alignment regulating force that vertically aligns the liquid crystal molecules 54*a* is sufficiently obtained. That is, in forming the alignment films 53, 55, light irradiation does not need to be performed under a high-temperature environment of equal to or higher than the nematic phase-isotropic phase transition temperature of the liquid crystal material, which enhances manufacturing efficiency. Here, the ambient temperature means 15° C. to 45° C.

The first monomer is a difunctional monomer having two acryloyl groups as a polymerizable group, and thus in forming the alignment films 53, 55, a polymerization rate is increased, and a monomer in an unpolymerized state is less likely to remain in the liquid crystal layer 54. As a result, the display device 100 having a high voltage holding rate is obtained. In contrast, when a monofunctional monomer having only one polymerizable group is used, the polymerization rate is decreased, and a lot of monomers in an unpolymerized state remain in the liquid crystal layer 54, which greatly reduces the voltage holding rate.

Specific examples of the second monomer include monomers represented by the following structural formulas (2-1) and (2-2).

[Chemical Formula 13]

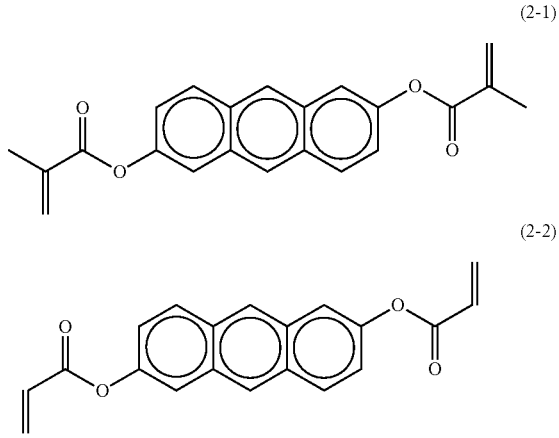

(2-1)

(2-2)

These monomers may be used alone or may be used in combination of two or more as appropriate. Thus, the second monomer may include at least one of the monomers represented by the structural formulas (2-1) and (2-2) above. In other words, the copolymer may include a structural unit derived from at least one of the monomers represented by the structural formulas (2-1) and (2-2) above as the structural unit derived from the second monomer.

Further, specific examples of the third monomer include monomers represented by the following structural formulas (3-1) and (3-2).

[Chemical Formula 14]

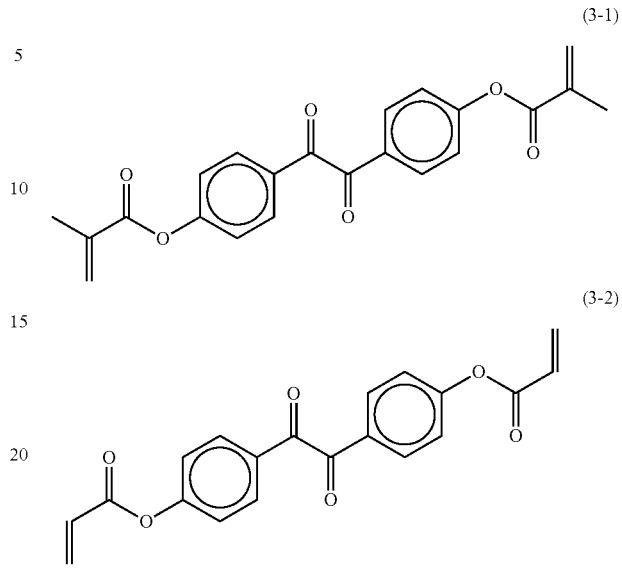

(3-1)

(3-2)

These monomers may be used alone or may be used in combination of two or more as appropriate. Thus, the third monomer may include at least one of the monomers represented by the structural formulas (3-1) and (3-2) above. In other words, the copolymer may include a structural unit derived from at least one of the monomers represented by the structural formulas (3-1) and (3-2) above as the structural unit derived from third monomers.

At least one of the second monomer and the third monomer is a polymerization initiator having a polymerization initiation function that initiates a copolymerization reaction of at least the first monomer and at least one of the second monomer and the third monomer. At least one of the second monomer and the third monomer absorbs near-ultraviolet to blue light (in other words, light having a wavelength in a wavelength band equal to or longer than 360 nm and equal to or shorter than 500 nm) to initiate polymerization.

In the present embodiment, the vertical alignment monomer and the monomer as the polymerization initiator are introduced into the liquid crystal cell as the liquid crystal alignment agent, together with the liquid crystal material. The liquid crystal alignment agent including the vertical alignment monomer and the monomer as the polymerization initiator can be copolymerized with near-ultraviolet light to blue visible light as described above, and can align the liquid crystal molecules 54*a* by the copolymerization. Thus, according to the present embodiment, the liquid crystal alignment agent is photopolymerized (in other words, the monomers are copolymerized) by using light emission of the light-emitting element 31 inside the liquid crystal cell, so that the alignment films 53, 55 can be formed without high-temperature firing.

As described above, the monomer as the polymerization initiator can initiate polymerization with near-ultraviolet to blue light. Accordingly, for the light-emitting element 31, only a light-emitting element that emits near-ultraviolet to blue light is used, as described above. Thus, according to the present embodiment, there is no need for color pixel segmentation of the light-emitting element 31, and a wide area in the pixel region can be used as the light-emitting region.

In this way, the wider light-emitting region eliminates the need to make the light-emitting element 31 have ultra-high luminance, and strengthens reliability. In addition, by widening the light-emitting region, polymerization of the monomers in the liquid crystal layer 54 can be performed uniformly, and thus a polymerized alignment layer can be formed uniformly over the entire display region as the alignment films 53, 55, so that it is possible to manufacture the liquid crystal element layer 5 having a uniform vertical alignment region over the entire display region.

On the other hand, as to the reflection-type liquid crystal elements 51, reflection does not occur in a dark place, and thus the display is difficult to see. However, according to the present embodiment, it is possible to improve visibility even in a dark place by compensating it by the light-emitting element 31. According to the present embodiment, as described above, each pixel P includes both the light-emitting element 31 and the reflection-type liquid crystal element 51, so that bright display can be achieved when using the light-emitting element 31. Further, not only the bright display can be achieved, but also luminance of each light-emitting element 31 can be lowered, so that it is possible to improve durability (long-term reliability).

As described above, the display device 100 according to the present embodiment is a hybrid display device including the light-emitting elements 31 and the reflection-type liquid crystal elements 51, and thus the visibility of the display device 100 is good even in a bright surrounding environment. In addition, high-temperature firing is not required to form the alignment films 53, 55, and thus the high-temperature firing does not cause damage such as a decrease in emission luminance of the light-emitting elements 31. Further, change in a retardation value of polyimide, polycarbonate, or the like due to high-temperature firing can be avoided, so that as described above, a flexible substrate can be used as the insulating substrates 1, 7 (support bodies).

Display Operation of Display Device 100

Next, a display operation of the display device 100 described above will be described.

In a case where the display device 100 is used under external light (in other words, in a case where external light is strong), when the external light enters from above the circular polarizer 8, the external light passes through the circular polarizer 8 to become circular polarized light, so that only right circular polarized light is transmitted through the circular polarizer 8, for example. At this time, in a case where a drain voltage of the second TFT 22 is a liquid crystal threshold voltage or less (in other words, in a case where a voltage applied to the liquid crystal layer 54 is less than the threshold voltage (including the case where no voltage is applied)), the external light that has become the right circular polarized light is incident on the liquid crystal layer 54 in a vertically aligned state. The birefringence of the liquid crystal layer 54 is substantially zero, and thus in a case where no voltage is applied to the second electrode 34, the right circular polarized light incident on the liquid crystal element 51 is incident as it is on the light-emitting element 31 via the insulating layer 4 as the right circular polarized light to reach the first electrode 32. When this right circular polarized light is reflected on the first electrode 32, the right circular polarized light becomes left circular polarized light, and then follows the reverse path to reach the circular polarizer 8. At this time, the polarization state is not changed by the liquid crystal layer 54. Thus, the left circular polarized light that has reached the circular polarizer 8 is absorbed by the circular polarizer 8 and is not transmitted through the circular polarizer 8. Thus, the display device 100 is in a dark display (black display) state. Further, at this time, the drain voltage of the second TFT 22 is less than a threshold voltage of the light-emitting element in which the first TFT 21 is operated, and no current is supplied to the light-emitting element 31, so that a non-light emission state (in other words, an off state) is maintained. In this case, a gray scale display is performed in the liquid crystal element 51.

In a case where the display device 100 is used under external light, when the drain voltage of the second TFT 22 is greater than the liquid crystal threshold voltage and smaller than the threshold voltage of the light-emitting element in which the first TFT 21 is operated, the external light that has been transmitted through the circular polarizer 8 and become the right circular polarized light is transmitted through the liquid crystal layer 54 to become linear polarized light. Thereafter, the linear polarized light that has reached the first electrode 32 is reflected on the first electrode 32, follows the reverse path, and is transmitted through the liquid crystal layer 54 to become right circular polarized light, and the right circular polarized light is transmitted through the circular polarizer 8. Thus, the display device 100 becomes in a bright display state, and displays a color of a wavelength determined by the color conversion layer 6. Further, at this time, the drain voltage of the second TFT 22 is less than the threshold voltage of the light-emitting element in which the first TFT 21 is operated, and no current is supplied to the light-emitting element 31, so that a non-light emission state (in other words, an off state) is maintained. Thus, in this case as well, a gray scale display is performed in the liquid crystal element 51.

In a case where the intensity of external light is weak, such as in a room, the drain voltage of the second TFT 22 is set to equal to or greater than the threshold voltage of the light-emitting element in which the first TFT 21 is operated. As a result, a current is supplied to the light-emitting element 31, which causes the light-emitting element 31 to emit light. In this case, the gray scale display is performed in the light-emitting element 31. It does not matter whether the liquid crystal element 51 is in an on state or an off state. However, the liquid crystal element 51 is preferably in a normally black mode that suppresses external light. In this case, light that has been transmitted through the liquid crystal layer 54 becomes linear polarized light due to the aligned state of the liquid crystal molecules 54a. The linear polarized light that has reached the first electrode 32 is reflected on the first electrode 32, follows the reverse path, and is transmitted through the liquid crystal layer 54 to become right circular polarized light, and the right circular polarized light is transmitted through the circular polarizer 8. Thus, in this case as well, the display device 100 displays the color of the wavelength determined by the color conversion layer 6. The display device 100 can display any color image by controlling a potential of the individual first electrodes 32.

Method for Manufacturing Display Device 100

Next, a method for manufacturing the display device 100 will be described.

Figure 2:
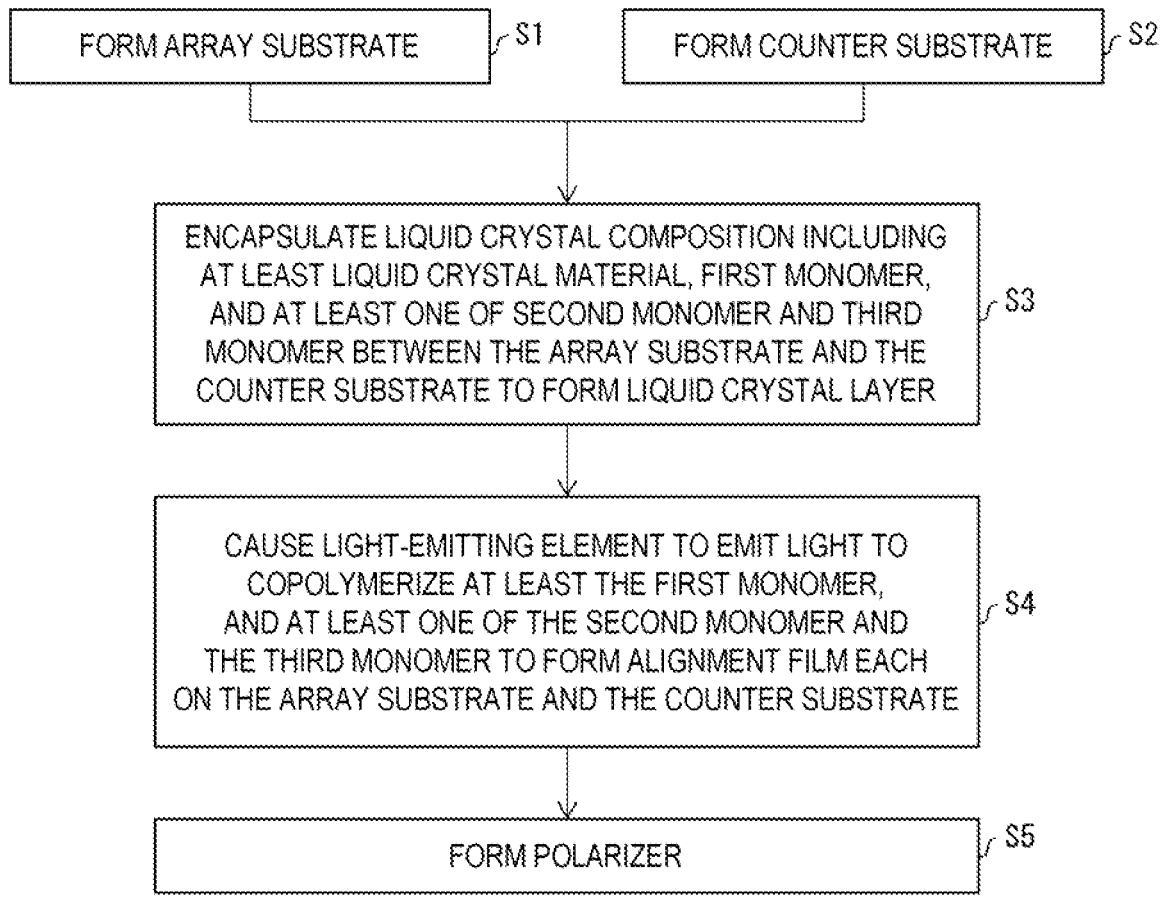
FIG. 2 is a flowchart illustrating a method for manufacturing the display device according to the embodiment.
Figure 3:
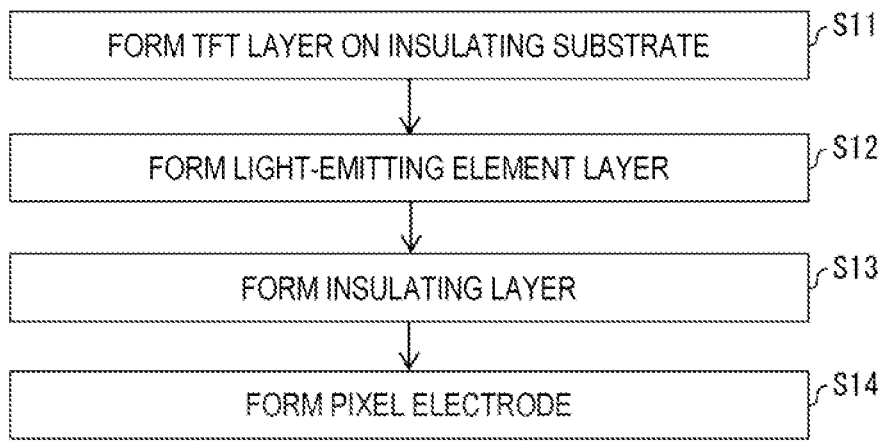
FIG. 3 is a flowchart illustrating a process of forming an array substrate illustrated in FIG. 2.
Figure 4:
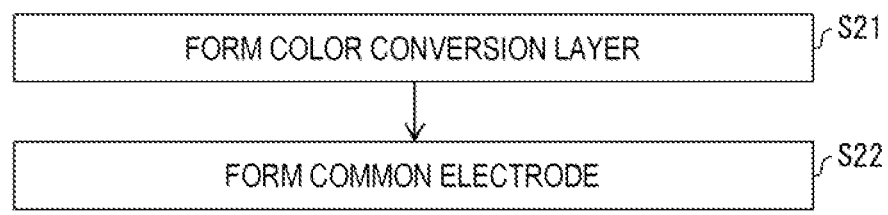
FIG. 4 is a flowchart illustrating a process of forming a counter substrate illustrated in FIG. 2.
Figure 5:
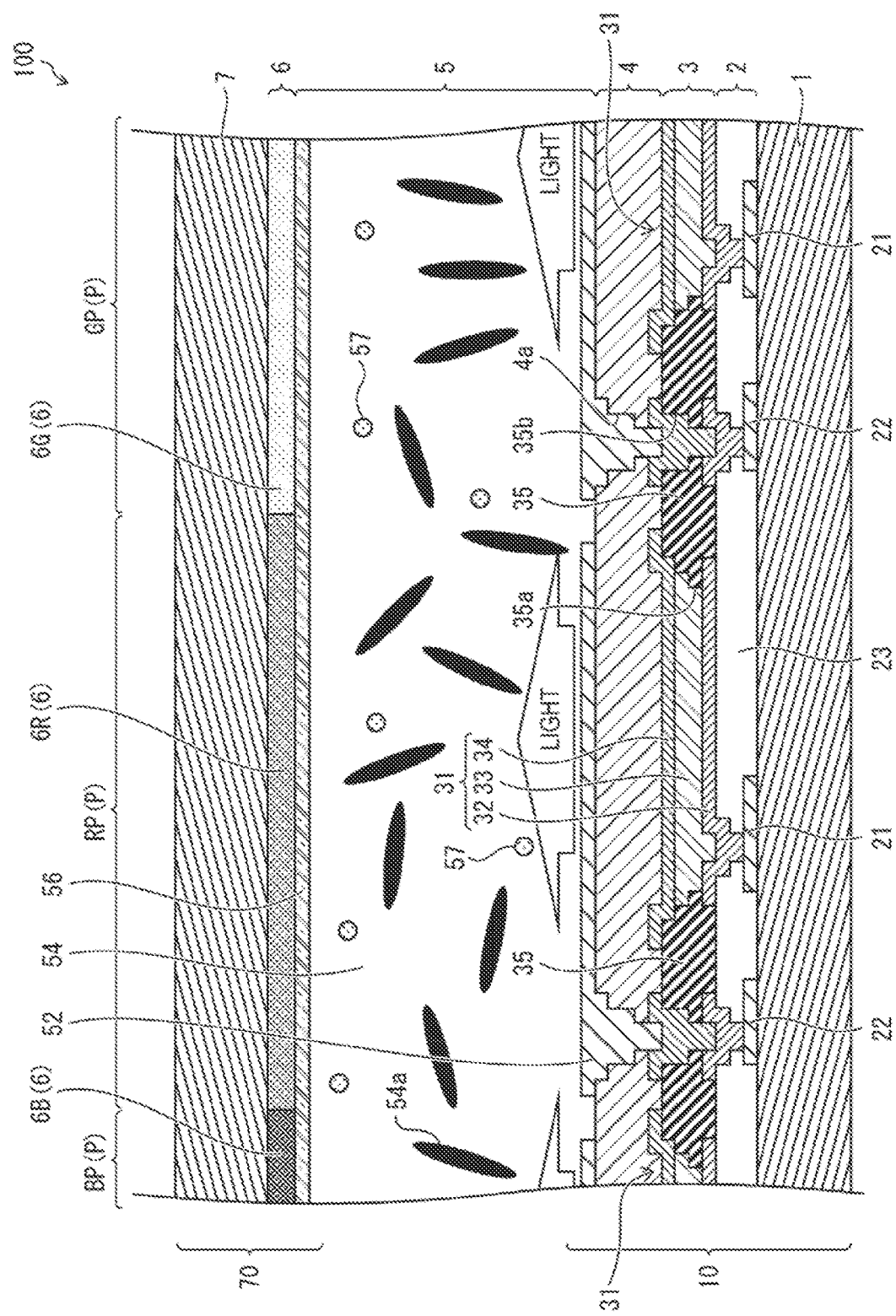
FIG. 5 is a cross-sectional view illustrating a schematic configuration of main portions of the display device according to the embodiment before formation of an alignment film.

FIG. 2 is a flowchart illustrating a method for manufacturing the display device 100 according to the present embodiment. FIG. 3 is a flowchart illustrating an array substrate forming step (S1) illustrated in FIG. 2. FIG. 4 is a flowchart illustrating a counter substrate forming step (S2) illustrated in FIG. 2. FIG. 5 is a cross-sectional view illustrating a schematic configuration of main portions of the display device 100 before forming an alignment film.

In the present embodiment, first, as illustrated in FIG. 2, as the array substrate, an array substrate 10 having no alignment film and including the insulating substrate 1, the TFT layer 2, the light-emitting element layer 3, the insulating layer 4, and the pixel electrode 52 is formed (S1, array substrate forming step). Note that here, the array substrate 10 having no alignment is indicative of the array substrate 10 before forming the alignment film 53.

On the other hand, as a counter substrate, a counter substrate 70 having no alignment film and including the insulating substrate 7, the color conversion layer 6, and the common electrode 56 is formed (S2, counter substrate forming step). Note that here, the counter substrate 70 having no alignment film is indicative of the counter substrate 70 before forming the alignment film 55.

The array substrate forming step (S1) includes a TFT layer forming step (S11), a light-emitting element layer forming step (S12), an insulating layer forming step (S13), and a pixel electrode forming step (S14) illustrated in FIG. 3. In the array substrate forming step (S1), first, the TFT layer 2 is formed on the insulating substrate 1 (S11). Next, the light-emitting element layer 3 including a plurality of the light-emitting elements 31 of a top emission type is formed on the TFT layer 2 (S12). Next, the insulating layer 4 having light transmissivity and covering the light-emitting element layer 3 is formed (S13). Next, the pixel electrode 52 is formed on the insulating layer 4 for each pixel P (S14). This forms the array substrate 10 including the insulating substrate 1, the TFT layer 2, the light-emitting element layer 3, the insulating layer 4, and the pixel electrode 52.

The counter substrate forming step (S2) includes a color conversion layer forming step (S21) and a common electrode forming step (S22) illustrated in FIG. 4. In the counter substrate forming step (S2), first, the color conversion layer 6 is formed on the insulating substrate 7 (S21). Next, the common electrode 56 is formed on the color conversion layer 6 (S22). This forms the counter substrate 70 including the insulating substrate 7, the color conversion layer 6, and the common electrode 56.

Next, as illustrated in FIG. 5, the array substrate 10 and the counter substrate 70 are bonded to each other with a constant gap therebetween. As illustrated in FIG. 5, a liquid crystal composition including at least a liquid crystal material (liquid crystal molecules 54a) and a liquid crystal alignment agent (monomer 57) including the first monomer and at least one of the second monomer and the third monomer is encapsulated in the gap. That is, the liquid crystal composition including at least the liquid crystal material (liquid crystal molecules 54a), and, as the monomer 57, the first monomer and at least one of the second monomer and the third monomer is encapsulated in the gap. This forms the liquid crystal layer 54 in the gap between the array substrate 10 and the counter substrate 70 (S3, liquid crystal layer forming step). As a result, a liquid crystal cell in which the array substrate 10 and the counter substrate 70 sandwich and hold the liquid crystal layer 54 is formed.

Note that a liquid crystal injection method may be used for forming the liquid crystal layer 54, or a one drop fill method may be used therefor.

In a case where the liquid crystal injection method is used for forming the liquid crystal layer 54, first, the array substrate 10 and the counter substrate 70 are bonded to each other by a sealing agent, leaving a liquid crystal injection port. Next, the liquid crystal composition is injected through the liquid crystal injection port, and then the liquid crystal injection port is closed. Note that the sealing agent may be formed in any of the array substrate 10 and the counter substrate 70.

When the one drop fill method is used for forming the liquid crystal layer 54, first, a sealing agent is applied on the surface of any one of the array substrate 10 and the counter substrate 70, and the liquid crystal composition is added dropwise to a region surrounded by the sealing agent. Thereafter, the array substrate 10 and the counter substrate 70 are bonded to each other by the sealing agent.

A content of the first monomer in the liquid crystal composition (in other words, a content of the first monomer in the liquid crystal composition before forming the alignment films 53, 55 in the alignment film forming step (S4)) is preferably from 0.3 wt. % or greater and 5 wt. % or less. In a case where the content of the first monomer in the liquid crystal composition is less than 0.3 wt. %, a state in which the liquid crystal molecules 54a are uniformly and stably aligned vertically in the liquid crystal layer 54 may be less likely to be achieved. In a case where the content of the first monomer in the liquid crystal composition is greater than 5 wt. %, the probability that unreacted monomer 57 remains in the liquid crystal layer 54 increases, causing a decrease in reliability over a long period of time. Further, in the alignment film forming step (S4) described below, it takes a long time for the first monomer to be completely polymerized. As a result, the unreacted monomer 57 remains, which may cause a decrease in voltage holding rate due to residual unreacted substance.

A total content of the second monomer and the third monomer in the liquid crystal composition before forming the alignment films 53, 55 in the alignment film forming step (S4) is preferably 0.01 wt. % or greater and 0.3 wt. % or less. In a case where the total content of the second monomer and the third monomer in the liquid crystal composition is less than 0.01 wt. %, the polymerization initiation function of the second monomer or the third monomer may be less likely to be exhibited in the alignment film forming step (S4) described below, so that it may take a long time for the polymerization reaction to be completed. In a case where the total content of the second monomer and the third monomer in the liquid crystal composition is greater than 0.3 wt. %, the probability that unreacted monomer 57 remains in the liquid crystal layer 54 increases, causing a decrease in reliability over a long period of time. Further, in the alignment film forming step (S4) described below, when the alignment films 53, 55 are formed, a lot of radicals are generated to increase the polymerization rate, but there may be a decrease in voltage holding rate due to residual unreacted substance.

Note that in the liquid crystal composition, the content of the first monomer is preferably equal to or greater than the total content of the second monomer and the third monomer. Specifically, in the monomer 57, the weight ratio of the first monomer to the second monomer and the third monomer is preferably 50:1 to 1:1. Note that here, "the weight ratio of the first monomer to the second monomer and the third monomer" is indicative of "weight of the first monomer:total weight of the second monomer and the third monomer". Further, the liquid crystal composition only needs to include at least the first monomer and at least one of the second monomer and the third monomer. Thus, the total weight of the second monomer and the third monomer includes a case where the weight of any one of the second monomer and the third monomer is 0 (zero).

Note that in addition to the liquid crystal material, the first monomer, and at least one of the second monomer and the third monomer, the liquid crystal composition may further include other monomers copolymerizable with these monomers, as the monomer 57. That is, in forming the alignment films 53, 55, the first monomer, at least one of the second monomer and the third monomer, and other monomers other than these monomers may be copolymerized. As a result, in addition to the structural unit derived from the first monomer and the structural unit derived at least one of the second monomer and the third monomer, a copolymer constituting the alignment films 53, 55 may further include a structural unit derived from the other monomers.

Next, as illustrated in FIG. 5, at least the first monomer and at least one of the second monomer and the third monomer are copolymerized by causing the light-emitting element 31 to emit light, as described above. As a result, the alignment film 53 is formed on the array substrate 10 to be in contact with the liquid crystal layer 54, while the alignment film 55 is formed on the counter substrate 70 to be in contact with the liquid crystal layer 54 (S4, alignment film forming step).

The alignment films 53, 55 each are a layer formed by phase separation of the copolymer generated by copolymerizing at least the first monomer and at least one of the second monomer and the third monomer, from the liquid crystal layer 54. At least one of the second monomer and the third monomer has a polymerization initiation function that absorbs near-ultraviolet to blue light to initiate polymerization. Thus, the copolymerization reaction of at least the first monomer and at least one of the second monomer and the third monomer is initiated, by causing the light-emitting element 31 to emit light. When the copolymerization reaction is initiated, the copolymer separated from the liquid crystal layer 54 is deposited in a film shape on a contact surface between the array substrate 10 and the liquid crystal layer 54, and a contact surface between the counter substrate 70 and the liquid crystal layer 54. This forms the alignment films 53, 55.

After forming the alignment films 53, 55, the liquid crystal layer 54 includes unreacted monomer 57 as illustrated in FIG. 1. The unreacted monomer 57 includes at least the first monomer and at least one of the second monomer and the third monomer. Specifically, the liquid crystal layer 54 includes, as the monomer 57, the first monomer and at least one of the second monomer and the third monomer in a proportion of 0.0001 wt. % to 0.2 wt. %, respectively. Note that 0.0001 wt. % is the detection limit, and 0.2 wt. % indicates a case where a light irradiation time is short. The unreacted monomer 57 can be detected by gas chromatography, liquid chromatography, or the like.

The copolymer is deposited with the alkyl chain directed in a constant direction, and accordingly, the liquid crystal molecules 54a are aligned. The alignment films 53, 55 can cause the liquid crystal molecules 54a in the liquid crystal material of the liquid crystal layer 54 to be aligned in a vertical direction with respect to the surfaces of the array substrate 10 and the counter substrate 70 by the action of the structural unit derived from the first monomer in the copolymer.

Further, in the present embodiment, as described above, the alignment films 53, 55 are formed after the array substrate 10 and the counter substrate 70 are bonded to each other by the sealing material, and thus a configuration in which the sealing material is in contact with the array substrate 10 and the counter substrate 70 can be achieved. Accordingly, the adhesion strength between the sealing material and the array substrate 10 and between the sealing material and the counter substrate 70 is sufficiently ensured, and thus, there is an advantage that even if a width of the sealing material is reduced in order to narrow a frame, the array substrate 10 and the counter substrate 70 are less likely to be peeled off.

Thereafter, the circular polarizer 8 is formed outside the counter substrate 70 constituting the liquid crystal cell (i.e., of the counter substrate 70, a side opposite to the surface facing the array substrate 10) (S5, polarizer forming step). This completes the display device 100 illustrated in FIG. 1.

Note that in a case where the insulating substrate 1 is a resin film, in the TFT layer forming step (S11), first, a resin film (resin layer) is formed as the insulating substrate 1 on a support substrate (e.g., a glass substrate such as mother glass), and then the TFT layer 2 is formed on the insulating substrate 1.

Similarly, in a case where the insulating substrate 7 is a resin film, in the color conversion layer forming step (S21), a resin film (resin layer) is formed as the insulating substrate 7 on a support substrate (e.g., a glass substrate such as mother glass), and then the color conversion layer 6 is formed on the insulating substrate 7.

Thus, in a case where the insulating substrate 1 is a resin film, the support substrate is provided on the surface of the array substrate 10 on the side opposite to the counter substrate 70. Further, in a case where the insulating substrate 7 is a resin film, the support substrate is provided on the surface of the counter substrate 70 on the side opposite to the array substrate 10. Thus, in the polarizer forming step (S5), in a case where the support substrate is provided on the surface of the counter substrate 70 on the side opposite to the array substrate 10, the circular polarizer 8 is formed at least after peeling off the support substrate provided on the counter substrate 70.

Next, the present embodiment will be described in more detail using Examples and Comparative Examples. However, the present embodiment is not limited to the following Examples.

Example 1

First, a polyimide layer was formed as a resin film that serves as an insulating substrate (flexible substrate) on a glass substrate as a support substrate. Subsequently, on the polyimide layer, a TFT layer, a blue OLED layer including a plurality of blue OLEDs as light-emitting elements, an insulating layer, and an ITO electrode as a pixel electrode are formed in this order. This formed an array substrate having no alignment film as the array substrate.

On the other hand, on a glass substrate as a support substrate, a polyimide layer was formed as a resin film that serves as an insulating substrate (flexible substrate), and a color conversion layer and an ITO electrode as a common electrode were formed in this order thereon. This formed a counter substrate having no alignment film as the counter substrate. For the color conversion layer 6, a red color conversion layer 6R corresponding to the pixel RP was formed, and a green color conversion layer 6G corresponding to the pixel GP was formed. For the remaining portion of the color conversion layer 6, a blue color filter was formed corresponding to the pixel BP.

Subsequently, the array substrate and the counter substrate were bonded to each other with a constant gap therebetween using a sealing agent. On the other hand, as the liquid crystal composition, a mixture of a liquid crystal material, a vertical alignment monomer represented by the structural formula (1-1), which is the first monomer, and an anthracene-based monomer (polymerization initiator) represented by the structural formula (2-1) was prepared. At this time, the liquid crystal material and the monomers were mixed in such a manner that a content of the vertical alignment monomer in the liquid crystal composition was 2 wt. %, and a content of the anthracene-based monomer in the liquid crystal composition was 0.1 wt. %.

The liquid crystal composition was then vacuum-injected into the gap, and the liquid crystal composition was encapsulated between the array substrate and the counter substrate to form a liquid crystal layer.

Next, photopolymerization is performed by lighting the blue OLEDs at room temperature (25° C.) for 10 minutes to form an alignment film on each of a contact surface between the array substrate and liquid crystal layer and a contact surface between the counter substrate and the liquid crystal layer. Subsequently, the glass substrate is peeled off from each of the array substrate and the counter substrate by a laser, so that the glass substrates outside the liquid crystal cell including the array substrate, the liquid crystal layer, and the counter substrate are peeled off. Finally, the circular polarizer is bonded to the polyimide layer of the liquid crystal cell from which the glass substrates have been peeled off on the counter substrate side to produce the display device according to the present Example.

Figure 6:
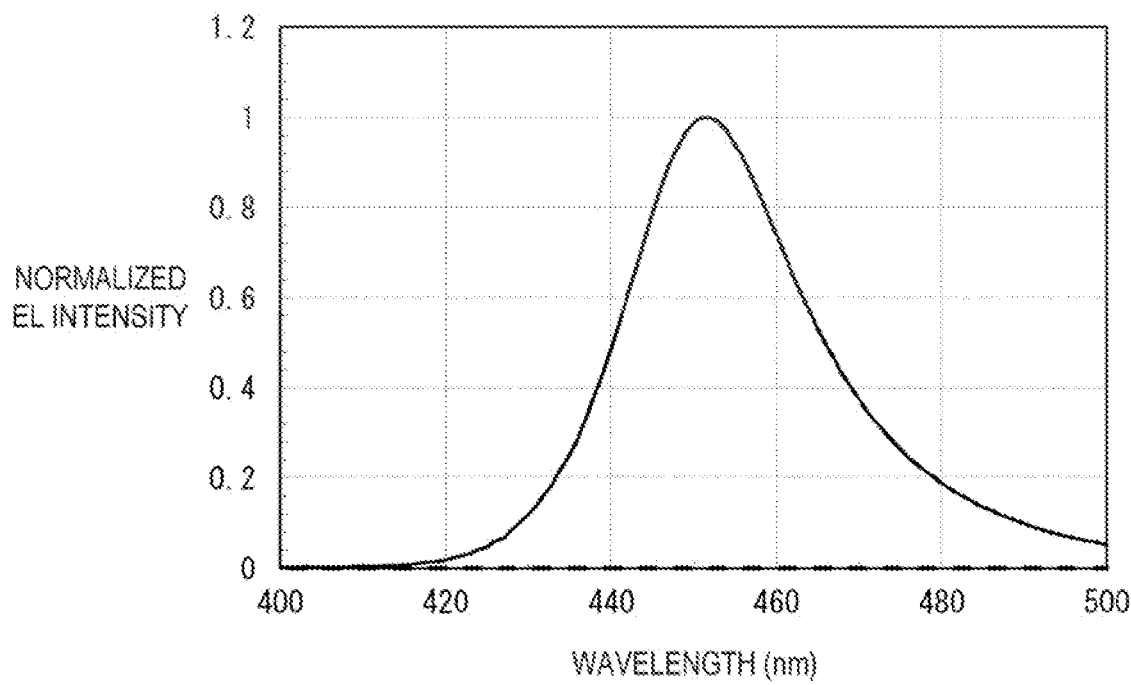
FIG. 6 is a graph showing an emission spectrum of a blue OLED used in Example 1.

FIG. 6 shows the emission spectrum of the blue OLED used in the present Example. Note that FIG. 6 shows an emission spectrum when the spectrum is normalized using the maximum intensity as 1.

Figure 7:
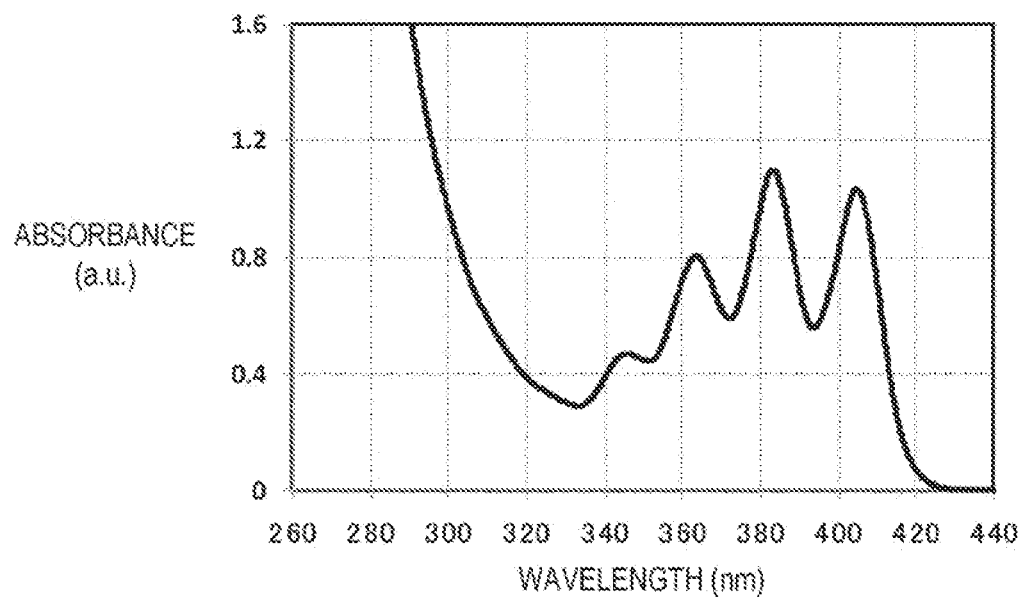
FIG. 7 is a graph showing an absorption spectrum of an anthracene-based monomer used in Example 1.

In addition, FIG. 7 illustrates an absorption spectrum of the anthracene-based monomer used in the present Example.

Figure 8:
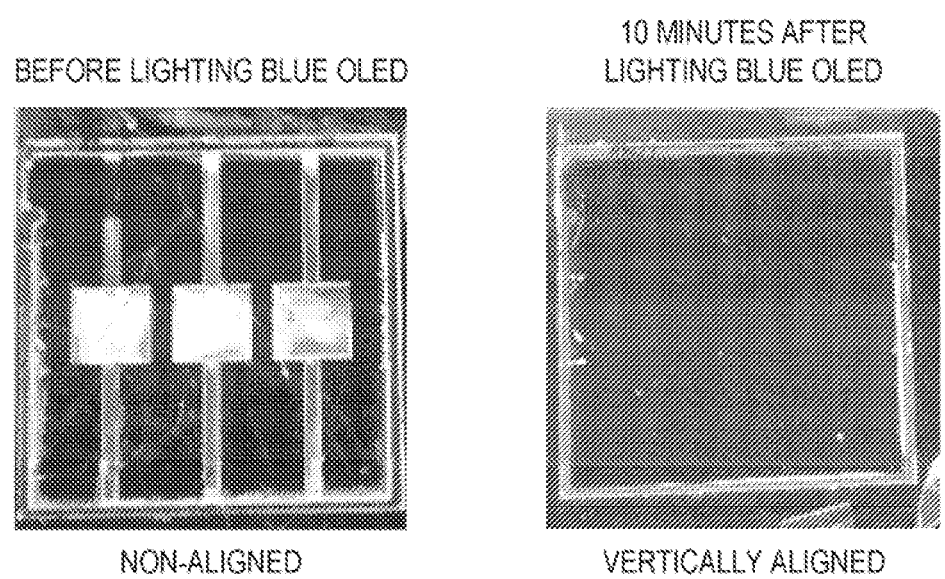
FIG. 8 is a diagram illustrating, side by side, light transmission states of a liquid crystal cell obtained in Example 1 when no voltage is applied, before and after lighting a blue OLED of the liquid crystal cell.

Further, the liquid crystal cell before peeling off the glass substrates was sandwiched between crossed-Nicol polarizers having transmission axis directions orthogonal to each other, and a light transmission state of the liquid crystal cell was observed, so that the alignment state of the liquid crystal molecules in the liquid crystal layer was confirmed. FIG. 8 illustrates, side by side, the light transmission states of the liquid crystal cell when no voltage was applied before and after lighting the blue OLEDs (in other words, before and after forming the alignment films), observed in this manner.

As illustrated in FIG. 8, when observed from directly above the liquid crystal cell, it can be seen that light is not transmitted and the liquid crystal molecules are aligned vertically after lighting the blue OLEDs. Accordingly, from the result described above, it can be found that the vertical alignment monomer and the anthracene-based monomer were copolymerized by blue light of the blue OLEDs to form the vertical alignment films.

Further, it has been found that the liquid crystal element and OLEDs thus obtained have high luminance when performing display by the OLEDs and have high contrast when performing display by the liquid crystal element, so that the long-term reliability is improved and the visual quality when performing display by the liquid crystal element is improved.

Example 2

In the present Example, as the liquid crystal composition, a mixture of a liquid crystal material, a vertical alignment monomer represented by the structural formula (1-1), which is the first monomer, and a benzyl-based monomer (polymerization initiator) represented by the structural formula (3-1) was prepared. At this time, the liquid crystal material and the monomers were mixed in such a manner that a content of the vertical alignment monomer in the liquid crystal composition was 1.2 wt. %, and a content of the benzyl-based monomer in the liquid crystal composition was 0.1 wt. %.

Then, a display device according to the present Example was produced in the same manner as Example 1, except that in Example 1, after the array substrate and the counter substrate were bonded to each other with a constant gap therebetween using a sealing agent, the liquid crystal composition was encapsulated in the gap to form a liquid crystal layer.

Figure 9:
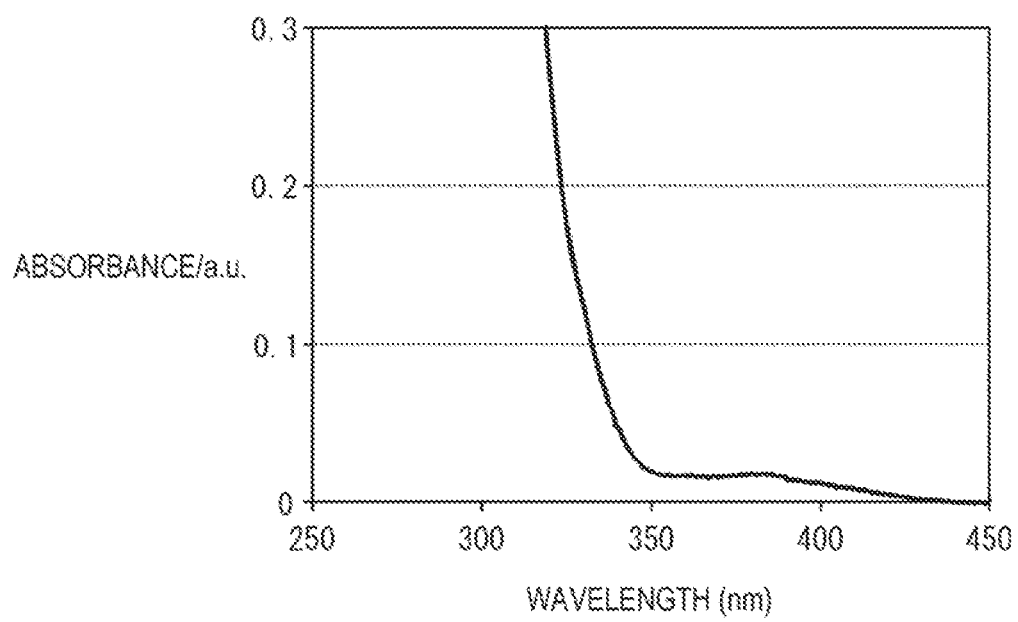
FIG. 9 is a graph showing an absorption spectrum of a benzyl-based monomer used in Example 2.

FIG. 9 shows an absorption spectrum of the benzyl-based monomer used in the present Example. Note that the emission spectrum of the blue OLED used in the present Example is the same as the emission spectrum of the blue OLED used in Example 1 shown in FIG. 7. Further, the absorption spectrum of the vertical alignment monomer used in the present Example is the same as the absorption spectrum of the vertical alignment monomer used in Example 1 shown in FIG. 8.

Figure 10:
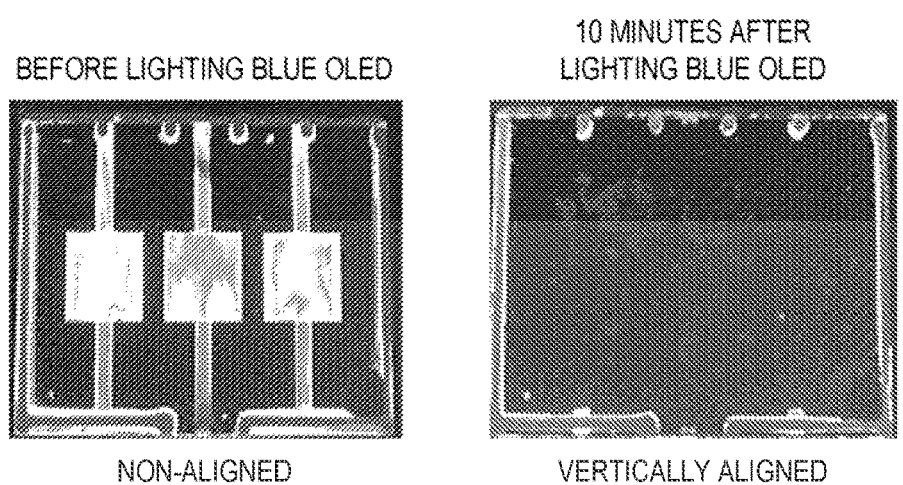
FIG. 10 is a diagram illustrating, side by side, light transmission states of a liquid crystal cell obtained in Example 2 when no voltage is applied, before and after lighting a blue OLED of the liquid crystal cell.

In addition, similarly to Example 1, the liquid crystal cell before peeling off the glass substrates, which was obtained in the present Example, was sandwiched between crossed-Nicol polarizers having transmission axis directions orthogonal to each other, and the light transmission state of the liquid crystal cell was observed, so that the alignment state of the liquid crystal molecules in the liquid crystal layer was confirmed. FIG. 10 illustrates, side by side, the light transmission state of the liquid crystal cell when no voltage was applied before and after lighting the blue OLEDs (in other words, before and after forming the alignment films), observed in this manner.

As illustrated in FIG. 10, when observed from directly above the liquid crystal cell, it can be seen that after lighting the blue OLEDs, light is not transmitted, a black display state is established, and the liquid crystal molecules are aligned vertically. In this manner, also in a case where the benzyl-based monomer was used as the polymerization initiator, the vertical alignment monomer and the benzyl-based monomer were copolymerized by blue light of the blue OLEDs to form the vertical alignment films.

Further, it has been found that the liquid crystal element and OLEDs thus obtained have high luminance when performing display by the OLEDs and have high contrast when performing display by the liquid crystal element, so that the long-term reliability is improved and the visual quality when performing display by the liquid crystal element is improved.

Comparative Example 1

In the present Comparative Example, as the liquid crystal composition, a mixture of a liquid crystal material, a vertical alignment monomer represented by the structural formula (1-1), which is the first monomer, and a biphenyl-based monomer represented by the following structural formula (6) was prepared.

[Chemical Formula 15]

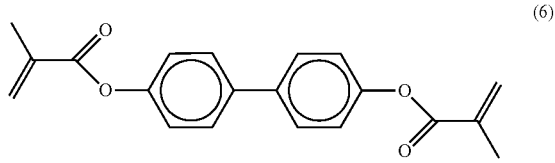

(6)

At this time, the liquid crystal material and the monomers were mixed in such a manner that a content of the vertical alignment monomer in the liquid crystal composition was 2 wt. %, and a content of the biphenyl-based monomer in the liquid crystal composition was 0.1 wt. %.

The biphenyl-based monomer is an ultraviolet-polymerizable monomer used in a polymer sustained alignment (PSA) technique. Note that the PSA technique is a technique in which a liquid crystal material including a photopolymerizable monomer is encapsulated in a liquid crystal panel and irradiated with an active energy ray such as ultraviolet light in a state where a voltage is applied to the liquid crystal layer to polymerize the photopolymerizable monomer.

Then, the display device according to the present Comparative Example was produced in the same manner as in Example 1, except that in Example 1, after the array substrate and the counter substrate were bonded to each other with a constant gap using a sealing agent, the liquid crystal composition was encapsulated in the gap to form a liquid crystal layer.

Figure 11:
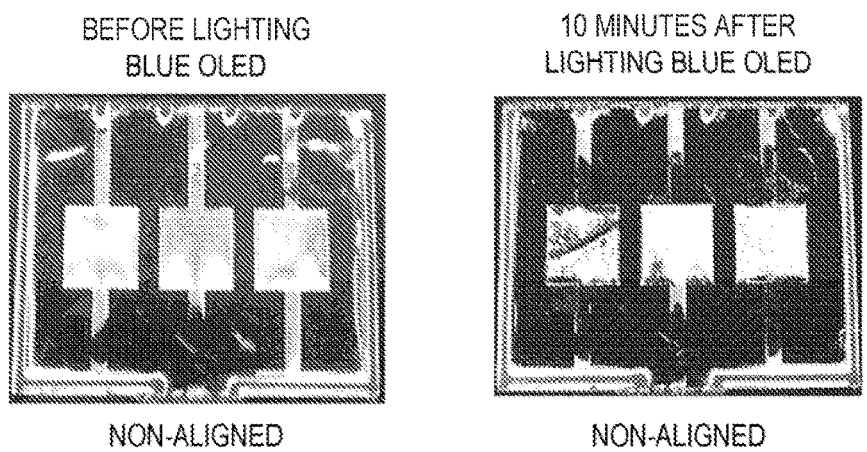
FIG. 11 is a diagram illustrating, side by side, light transmission states of a liquid crystal cell obtained in Comparative Example 1 when no voltage is applied, before and after lighting a blue OLED of the liquid crystal cell.

In addition, similarly to Example 1, the liquid crystal cell before peeling off the glass substrates, which was obtained in the present Comparative Example, was sandwiched between crossed-Nicol polarizers having transmission axis directions orthogonal to each other, and the light transmission state of the liquid crystal cell was observed, so that the alignment state of the liquid crystal molecules in the liquid crystal layer was confirmed. FIG. 11 illustrates, side by side, the light transmission states of the liquid crystal cell when no voltage was applied before and after lighting the blue OLEDs (in other words, before and after forming the alignment films), observed in this manner.

As illustrated in FIG. 11, when observed from directly above the liquid crystal cell, light is transmitted through the liquid crystal cell and the black display state has not been achieved, even after lighting the blue OLEDs. Thus, it can be found that the liquid crystal molecules are not vertically aligned. As described above, in the present Comparative Example, it was attempted that the vertical alignment monomer was combined with the biphenyl-based monomer to form the alignment films by visible light irradiation, but the liquid crystal molecules could not be aligned vertically, and remains unaligned. Accordingly, it has been determined that even if the vertical alignment monomer was combined with the biphenyl-based monomer, it was impossible to form a vertical alignment film, and it was impossible to form a liquid crystal element that performs display by the VA method.

Comparative Example 2

In the present Comparative Example, as the liquid crystal composition, a mixture of a liquid crystal material and the vertical alignment monomer represented by the structural formula (1-1), which is the first monomer, was prepared.

At this time, the liquid crystal material and the vertical alignment monomer are mixed in such a manner that a content of the vertical alignment monomer in the liquid crystal composition was 2 wt. %.

Then, the display device according to the present Comparative Example was produced in the same manner as in Example 1, except that in Example 1, after the array substrate and the counter substrate were bonded to each other with a constant gap using a sealing agent, the liquid crystal composition was encapsulated in the gap to form a liquid crystal layer.

Figure 12:
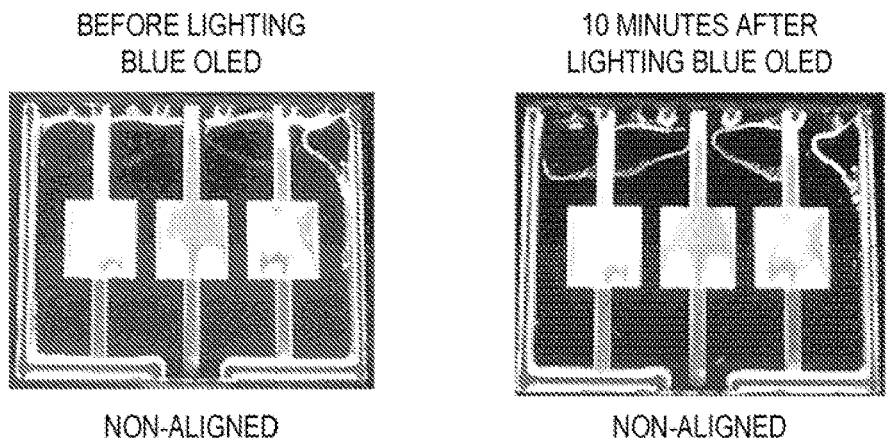
FIG. 12 is a diagram illustrating, side by side, light transmission states of a liquid crystal cell obtained in Comparative Example 2 when no voltage is applied, before and after lighting a blue OLED of the liquid crystal cell.

In addition, similarly to Example 1, the liquid crystal cell before peeling off the glass substrates, which was obtained in the present Comparative Example, was sandwiched between crossed-Nicol polarizers having transmission axis directions orthogonal to each other, and the light transmission state of the liquid crystal cell was observed, so that the alignment state of the liquid crystal molecules in the liquid crystal layer was confirmed. FIG. 12 illustrates, side by side, the light transmission states of the liquid crystal cell when no voltage was applied before and after lighting the blue OLEDs (in other words, before and after forming the alignment films), observed in this manner.

As illustrated in FIG. 12, when observed from directly above the liquid crystal cell, light is transmitted through the liquid crystal cell and the black display state is not achieved, even after lighting the blue OLEDs. Thus, it can be found that the liquid crystal molecules are not vertically aligned. As described above, in the present Comparative Example, it was attempted that the vertical alignment monomer was polymerized by visible light irradiation to form an alignment film, but the liquid crystal molecules could not be aligned vertically, and remains unaligned. Accordingly, it has been determined that it was impossible to form the vertical alignment film using only the vertical alignment monomer, and it was impossible to form a liquid crystal element that performs display by the VA method.

Comparative Example 3

First, in the same manner as in Example 1, a polyimide layer, a TFT layer, a blue OLED layer, an insulating layer, and an ITO electrode were layered in this order on a glass substrate to form an array substrate having no alignment film, similar to that of Example 1, as the array substrate. Thereafter, for forming the alignment film, a polyamic acid solvent was applied by spin coating to a surface of the array substrate on the ITO electrode-forming side, and heated and fired at 230° C. for 60 minutes. This formed an alignment film on the surface of the array substrate.

On the other hand, in the same manner as in Example 1, a polyimide layer, a color conversion layer, and an ITO electrode were layered in this order on a glass substrate to form a counter substrate having no alignment film, similar to that of Example 1, as the counter substrate. Thereafter, for forming the alignment film, a polyamic acid solvent was applied by spin coating to a surface of the counter substrate on the ITO electrode-forming side, and heated and fired at 230° C. for 60 minutes. This formed an alignment film on the surface of the counter substrate.

Next, a sealing agent was applied to a surface of the array substrate on the alignment film-forming side, the liquid crystal material was added dropwise into a region surrounded by the sealing agent, and then the counter substrate was bonded thereto, thereby forming a vertical alignment liquid crystal layer.

Thereafter, the glass substrate was peeled off from each of the array substrate and the counter substrate to laser-peel off the glass substrates outside the liquid crystal cell including the array substrate, the liquid crystal layer, and the counter substrate.

The display by the liquid crystal element thus formed was confirmed in the same manner as in Example 1, and unevenness of alignment was observed. As the reason, it is considered that thermal expansion of the polyimide layer, which is a flexible substrate, occurred partially.

As described above, according to the present embodiment, the alignment films 53, 55 that can align the liquid crystal molecules 54a vertically can be formed without high-temperature firing, and without light irradiation from array substrate 10 side or the counter substrate 70 side. This makes it possible to manufacture the display device 100 for performing display of the liquid crystal elements 51 by a vertical alignment method (e.g., a VA method) as the display device 100.

Modified Example 1

Note that in the present embodiment, description has been given using a case where the light-emitting element 31 is an OLED as an example. However, the light-emitting element 31 may be a quantum dot light-emitting diode (QLED) that has quantum dots (QDs) as a light-emitting material. In a case where the light-emitting element 31 is a QLED, a QD light-emitting layer including QDs made of semiconductor nanoparticles is used for the light-emitting layer. Further, an inorganic layer is suitably used for a layer other than the light-emitting layer in the function layer 33.

In a case where the light-emitting element 31 is an OLED, holes and electrons recombine inside the light-emitting layer in response to a drive current between the first electrode 32 and the second electrode 34, and light is emitted when excitons generated in this manner transition to a ground state.

On the other hand, in a case where the light-emitting element 31 is a QLED, holes and electrons recombine inside the light-emitting layer in response to a drive current between the first electrode 32 and the second electrode 34, and light is emitted when excitons generated in this manner transition from a conduction band level to a valence band level of the QDs.

Alternatively, a light-emitting element other than the OLED or the QLED (such as an inorganic light-emitting diode) may be formed as the light-emitting element 31.

Modified Example 2

Further, in the present embodiment, description has been given using a case where the color conversion layer 6 is provided on the array substrate 10 side of the counter substrate 70 as an example, but the present embodiment is not limited thereto. The color conversion layer 6 may be provided directly above the light-emitting element layer 3 in the array substrate 10, for example. However, in this case, when the insulating layer 4 is an inorganic layer, it is difficult to form the uniform color conversion layer 6 due to the effect of unevenness by formation of the light-emitting element 31, which causes display unevenness. Accordingly, in this case, the insulating layer 4 is desirably a flattening layer.

Note that the color conversion layer 6 can be provided on a side of the counter substrate 70 opposite to the array substrate 10 (in other words, a side of a surface opposite to a surface facing the insulating substrate 1, of the insulating substrate 7). However, the thickness of the insulating substrate 7 is typically 0.1 mm or greater, and a distance from the light-emitting layer of the light-emitting element 31 to the color conversion layer 6 increases. This reduces color viewing angle characteristics. Accordingly, the color conversion layer 6 is desirably provided on the array substrate 10 side of the counter substrate 70.

Modified Example 3

In FIG. 1, description has been given using a case where the circular polarizer 8 is provided outside the counter substrate 70 as the polarizer, as an example. However, the present embodiment is not limited thereto, and linear polarizers may be provided sandwiching the liquid crystal element layer 5. However, in this case, it is necessary to make the light-emitting element 31 always in an on state.

In other words, in the present embodiment, description has been given using a case where the display device 100 includes a reflection-type liquid crystal element as the liquid crystal element 51, as an example. However, the present embodiment is not limited thereto, and the display device 100 according to the present embodiment only needs to include the alignment films 53, 55 using the liquid crystal alignment agent. Accordingly, the display device 100 according to the present embodiment may be a display device having the light-emitting element 31 as a backlight, or may include a transmission type liquid crystal element as the liquid crystal element 51.

Modified Example 4

Further, in the present embodiment, description has been given using a case where the liquid crystal element 51 is a liquid crystal element that performs display by, for example, the VA method, as an example.

The liquid crystal element 51 of vertical alignment has a higher contrast than the liquid crystal element 51 of horizontal alignment, and has a smaller feeling of strangeness with respect to the light-emitting element 31 of an OLED or the like inherently having a high contrast. As described above, the light-emitting element 31 emits only blue light, and thus there is no need for color pixel segmentation in the light-emitting element 31, so that a wide area in the pixel P can be made the light-emitting element 31.

However, the liquid crystal element 51 may be a liquid crystal element that performs display by, for example, an in-plane switching (IPS) method. In the IPS method, with respect to the array substrate 10 and the counter substrate 70, in a transverse electric field in an in-plane direction, the liquid crystal molecules 54a are rotated in parallel to these substrates.

Even in a case where the liquid crystal element 51 is aligned by the transverse electric field in this manner, he liquid crystal alignment agent can be suitably used as the alignment film material. Note that in this case, the liquid crystal molecules 54a use a liquid crystal material having a positive dielectric anisotropy as the liquid crystal material.

Modified Example 5

Further, in the present embodiment, description has been given using a case where all the light-emitting elements 31 each are a light-emitting element that emits near-ultraviolet to blue light, as an example. However, the light-emitting element layer 3 may further include a red light-emitting element that emits red light, and a green light-emitting element that emits green light, in addition to the above light-emitting element, as the light-emitting element 31.

However, even in this case, it is desirable to increase a light-emitting region of the light-emitting element that emits near-ultraviolet to blue light as much as possible. It is not necessary to make the light-emitting element 31 have high luminance by increasing the light-emitting region of the light-emitting element that emits near-ultraviolet to blue light as much as possible, which is advantageous in reliability.

Further, as described above, the alignment films 53, 55 each are a polymerized alignment layer that polymerizes by near-ultraviolet to blue light. It is difficult for the alignment films 53, 55 to polymerize by light emitted from the red light-emitting element and the green light-emitting element. Accordingly, it is desirable that the entire light-emitting area of the light-emitting element layer 3 emit near-ultraviolet to blue light, and it is desirable that the entire liquid crystal layer 54 be uniformly irradiated with blue light. As described above, it is possible to polymerize the monomer 57 uniformly in the liquid crystal layer 54 in forming the alignment films 53, 55 by widening the light-emitting region of the light-emitting element that emits near-ultraviolet to blue light.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. An alignment film for aligning liquid crystals, the alignment film comprising at least a copolymer of: a first monomer represented by the following general formula (1)

[Chemical Formula 1]

(1)

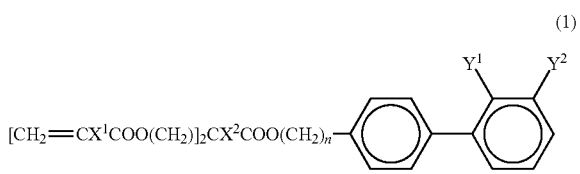

where $X^1$ and $X^2$ each independently represent —H, —CH$_3$, or —C$_2$H$_5$, Z represents —O—, —S—, —NH—, —CO—, —COO—, —OCO—, or a direct bond, $Y^1$ and $Y^2$ each independently represent —H, —F, —Cl, —Br, a linear, branched, or cyclic alkyl group having 1 to 6 carbon atoms, or a linear, branched, or cyclic alkyloxy having 1 to 6 carbon atoms, m represents an integer of 6 to 16, and n represents an integer of 8 to 24; and at least one of a second monomer represented by the following general formula (2)

[Chemical Formula 2]

(2)

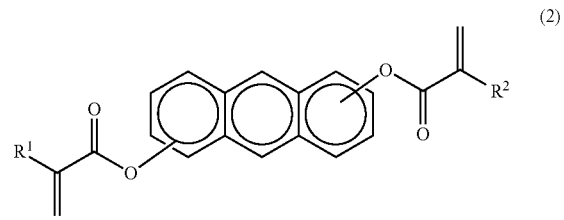

where $R^1$ and $R^2$ each independently represent a hydrogen atom or a methyl group, and a third monomer represented by the following general formula (3)

[Chemical Formula 3]

(3)

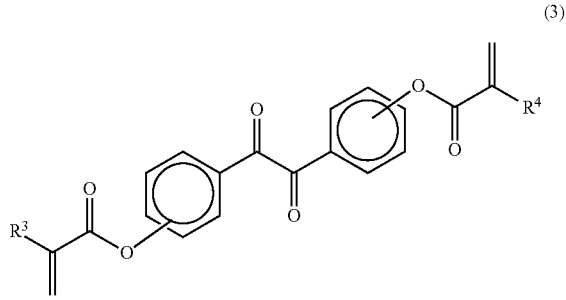

where $R^3$ and $R^4$ each independently represent a hydrogen atom or a methyl group.

2. The alignment film according to claim 1, wherein the first monomer includes at least one of monomers represented by the following structural formulas (1-1) to (1-8)

[Chemical Formula 4]

(1-1)

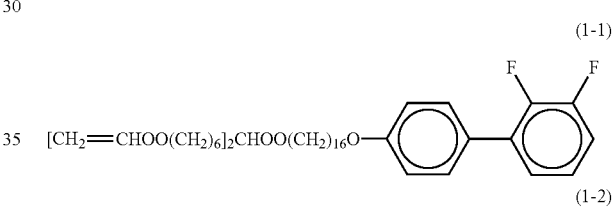

(1-2)

(1-3)

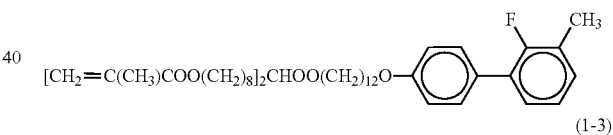

(1-4)

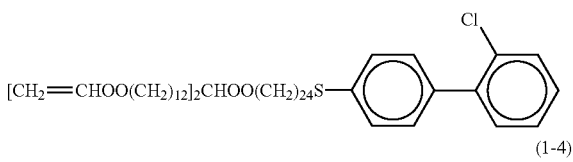

(1-5)

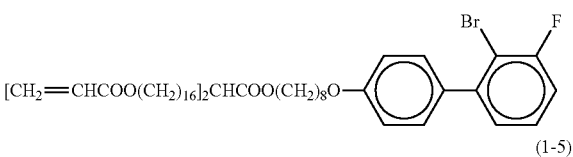

(1-6)

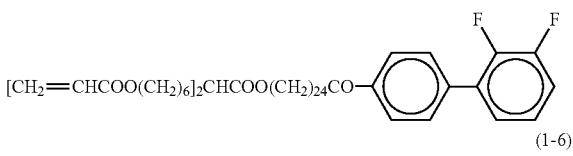

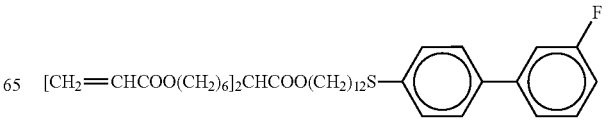

(1-7)

[CH₂=CHCOO(CH₂)₆]₂C(CH₃)COO(CH₂)₁₆O— 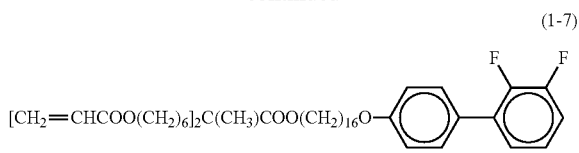

(1-8)

[CH₂=C(CH₃)COO(CH₂)₆]₂CHOO(CH₂)₁₆O— 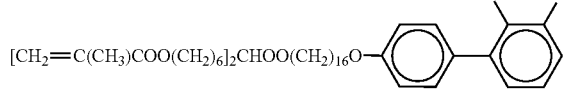

3. The alignment film according to claim 1,
wherein the second monomer includes at least one of monomers represented by the following structural formulas (2-1) and (2-2)

[Chemical Formula 5]

(2-1)

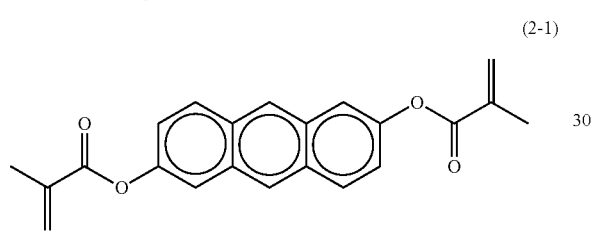

(2-2)

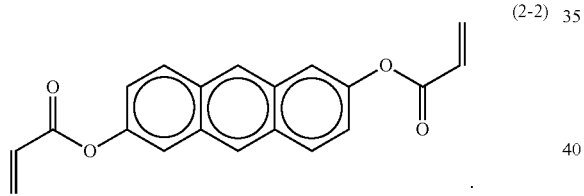

4. The alignment film according to claim 1,
wherein the third monomer includes at least one of monomers represented by the following structural formulas (3-1) and (3-2)

[Chemical Formula 6]

(3-1)

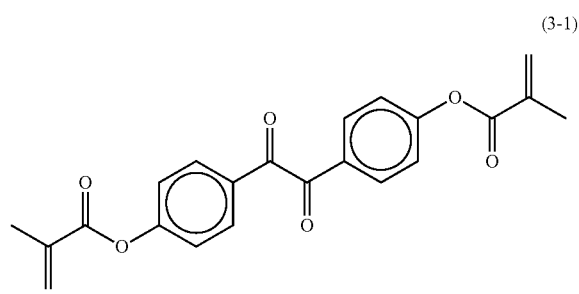

(3-2)

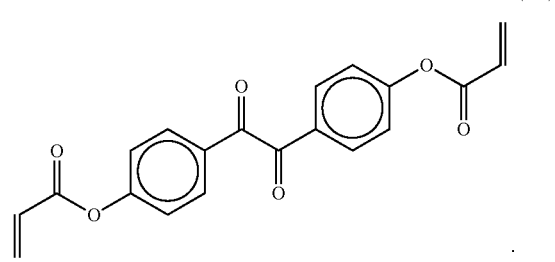

5. The alignment film according to claim 1,
wherein at least one of the second monomer and the third monomer is a polymerization initiator that absorbs near-ultraviolet to blue light to initiate polymerization.

6. The alignment film according to claim 1,
wherein at least one of the second monomer and the third monomer is a polymerization initiator that absorbs light having a wavelength in a wavelength band equal to or longer than 360 nm and equal to or shorter than 500 nm to initiate polymerization.

7. The alignment film according to claim 1,
wherein the copolymer includes a copolymer represented by the following structural formula (4)

[Chemical Formula 7]
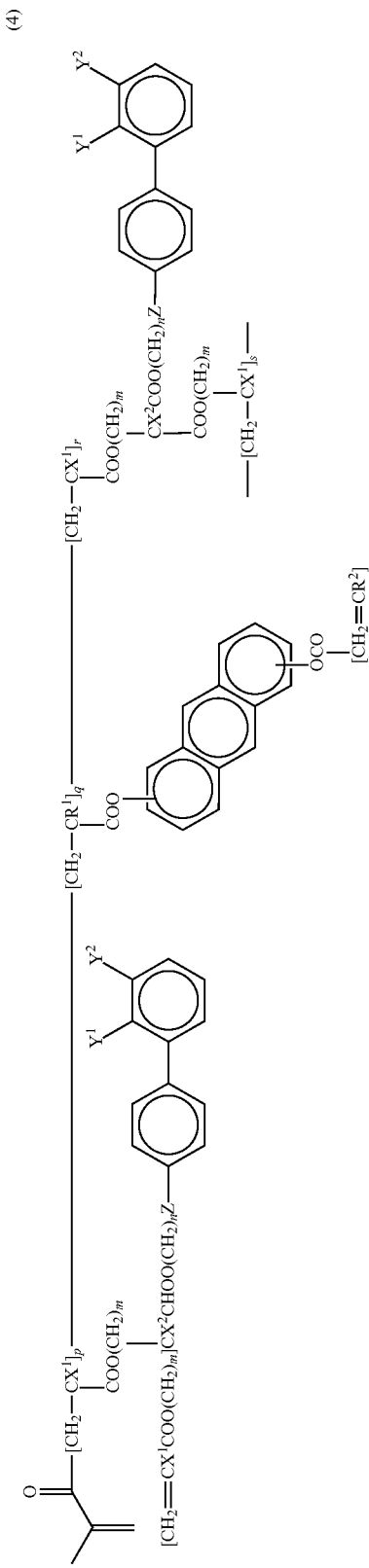

where $X^1$ and $X^2$ each independently represent —H, —$CH_3$, or —$C_2H_5$, z represents —O—, —S—, —NH—, —CO—, —COO—, —OCO—, or a direct bond, $Y^1$ and $Y^2$ each independently represent —H, —F, —Cl, —Br, a linear, branched, or cyclic alkyl group having 1 to 6 carbon atoms, or a linear, branched, or cyclic alkyloxy having from 1 to 6 carbon atoms, $R^1$ and $R^2$ each independently represent a hydrogen atom or a methyl group, m represents an integer from 6 to 16, n represents an integer from 8 to 24, p represents an integer of 1 to 100, q represents an integer from 1 to 50, r represents an integer from 1 to 100, and s represents an integer from 1 to 100.

8. The alignment film according to claim 1, wherein the copolymer includes a copolymer represented by the following structural formula (5)

[Chemical Formula 8]

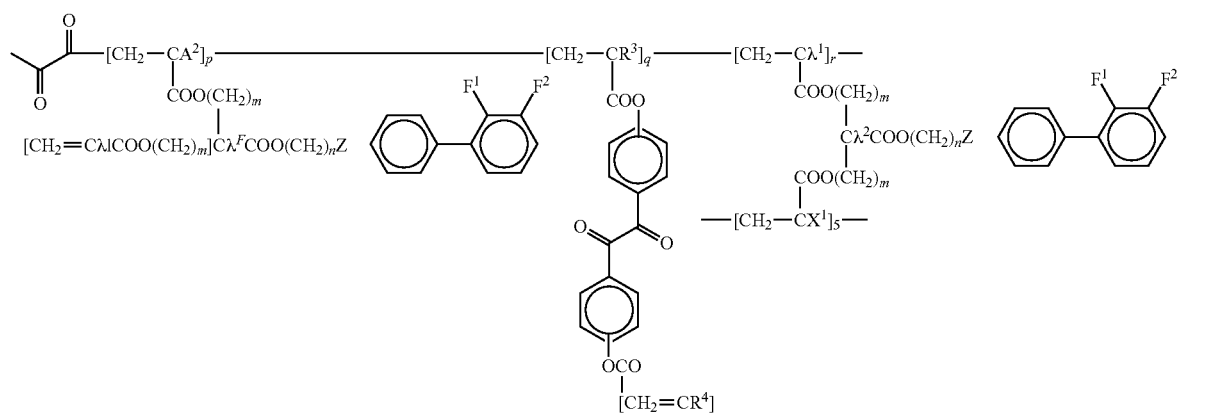

(5)

where $X^1$ and $X^2$ each independently represent —H, —$CH_3$, or —$C_2H_5$, z represents —O—, —S—, —NH—, —CO—, —COO—, —OCO—, or a direct bond, $Y^1$ and $Y^2$ each independently represent —H, —F, —Cl, —Br, a linear, branched, or cyclic alkyl group having from 1 to 6 carbon atoms, or a linear, branched, or cyclic alkyloxy having from 1 to 6 carbon atoms, $R^3$ and $R^4$ each independently represent a hydrogen atom or a methyl group, m represents an integer of 6 to 16, n represents an integer from 8 to 24, p represents an integer from 1 to 100, q represents an integer from 1 to 50, r represents an integer from 1 to 100, and s represents an integer from 1 to 100.

9. A display device comprising:
between a first insulating substrate and a second insulating substrate,
a thin film transistor layer including a plurality of thin film transistors;
a light-emitting element layer including a plurality of light-emitting elements;
a first alignment film;
a liquid crystal layer; and
a second alignment film, in this order from the first insulating substrate side,
wherein at least one of the first alignment film and the second alignment film is the alignment film described in claim 1.

10. The display device according to claim 9, wherein the liquid crystal layer includes the first monomer and at least one of the second monomer and the third monomer.

11. The display device according to claim 9, wherein the liquid crystal layer is a vertical alignment liquid crystal layer.

12. The display device according to claim 9, further comprising:
a polarizer.

13. The display device according to claim 12, wherein the polarizer is a circular polarizer, and the polarizer is provided on a side of the second insulating substrate of the pair of insulating substrates, the side opposite to the first insulating substrate.

14. The display device according to claim 9, wherein the light-emitting element is a light-emitting element configured to emit near-ultraviolet to blue light.

15. The display device according to claim 9, wherein the light-emitting element is a light-emitting element configured to emit light having a wavelength in a wavelength band equal to or longer than 360 nm and equal to or shorter than 500 nm.

16. The display device according to claim 9, further comprising:
a plurality of pixels,
wherein the light-emitting element is formed for each of the plurality of pixels and emits light in a color common to the plurality of pixels.

17. The display device according to claim 16, wherein the light-emitting element is a light-emitting element that emits blue light,
the plurality of pixels includes a red pixel that emits red light, a green pixel that emits green light, and a blue pixel that emits blue light,
the red pixel includes a red color conversion layer that converts light emitted from the light-emitting element into red light, and
the green pixel includes a green color conversion layer that converts light emitted from the light-emitting element into green light.

18. The display device according to claim 16,
wherein the light-emitting element is a light-emitting element that emits near-ultraviolet light,
the plurality of pixels include a red pixel that emits red light, a green pixel that emits green light, and a blue pixel that emits blue light,
the red pixel includes a red color conversion layer that converts light emitted from the light-emitting element into red light,
the green pixel includes a green color conversion layer that converts light emitted from the light-emitting element into green light, and
the blue pixel includes a blue color conversion layer that converts light emitted from the light-emitting element into blue light.

19. The display device according to claim 17, comprising: both the red and green color conversion layers between the second alignment film and the second insulating substrate.

20. A method for manufacturing a display device described in claim 9, the method comprising:

forming an array substrate including the first insulating substrate, the thin film transistor layer, and the light-emitting element layer;

forming a counter substrate including the second insulating substrate;

encapsulating, between the array substrate and the counter substrate, a liquid crystal composition including at least a liquid crystal material, the first monomer, and at least one of the second monomer and the third monomer to form a liquid crystal layer; and copolymerizing at least the first monomer and at least one of the second monomer and the third monomer by causing the light-emitting element to emit light to form the first alignment film on the array substrate to be in contact with the liquid crystal layer, while forming the second alignment film on the counter substrate to be in contact with the liquid crystal layer.

* * * * *